United States Patent
Graham et al.

(10) Patent No.: US 10,094,035 B1
(45) Date of Patent: Oct. 9, 2018

(54) CONVECTION OPTIMIZATION FOR MIXED FEATURE ELECTROPLATING

(71) Applicant: Lam Research Corporation, Fremont, CA (US)

(72) Inventors: Gabriel Hay Graham, Portland, OR (US); Lee Peng Chua, Beaverton, OR (US); Boon Kang Ong, Beaverton, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 15/785,251

(22) Filed: Oct. 16, 2017

(51) Int. Cl.
| | | |
|---|---|---|
| *C25D 5/08* | (2006.01) | |
| *C25D 7/12* | (2006.01) | |
| *C25D 17/00* | (2006.01) | |
| *C25D 21/10* | (2006.01) | |
| *C25D 21/12* | (2006.01) | |
| *C25D 5/02* | (2006.01) | |

(Continued)

(52) U.S. Cl.
CPC ............... *C25D 5/08* (2013.01); *C25D 5/022* (2013.01); *C25D 5/48* (2013.01); *C25D 7/123* (2013.01); *C25D 17/001* (2013.01); *C25D 21/10* (2013.01); *C25D 21/12* (2013.01); *H01L 24/11* (2013.01); *H01L 24/13* (2013.01); *H01L 24/14* (2013.01); *H01L 2224/1162* (2013.01); *H01L 2224/11462* (2013.01); *H01L 2224/11849* (2013.01); *H01L 2224/13147* (2013.01); *H01L 2224/13611* (2013.01); *H01L 2224/13639* (2013.01); *H01L 2224/1401* (2013.01)

(58) Field of Classification Search
CPC ........ C25D 5/08; C25D 7/123; C25D 17/001; C25D 21/10; C25D 21/12; C25D 5/022; H01L 24/13
See application file for complete search history.

(56) References Cited

U.S. PATENT DOCUMENTS 6,162,728 A * 12/2000 Tsao .................... H01L 21/7684
                                                          257/E21.583
8,795,480 B2 * 8/2014 Mayer .................. C25D 17/001
                                                                  204/212

(Continued)

OTHER PUBLICATIONS

Said et al., Forced convection magnetoelectroplating for enhanced semiconductor metallization; Journal of Vacuum Science & Technology A: Vacuum, Surfaces, and Films 22, pp. 452-460 (2004).*

(Continued)

*Primary Examiner* — John P Dulka
(74) *Attorney, Agent, or Firm* — Weaver Austin Villeneuve & Sampson LLP

(57) ABSTRACT

Various embodiments herein relate to methods and apparatus for electroplating material onto substrates. Often the substrate is a semiconductor substrate. Various techniques described herein utilize a number of different electroplating stages, where the convection conditions vary between the different electroplating stages. In many cases, at least one ultra-low convection stage is used. The ultra-low convection stage may be paired with an initial stage and a final stage that have higher convection conditions. By controlling the convection conditions as described herein, very uniform plating results can be achieved, even when differently sized and/or shaped features are provided on a single substrate.

19 Claims, 10 Drawing Sheets

(51) Int. Cl.
  *H01L 23/00*  (2006.01)
  *C25D 5/48*  (2006.01)

(56) References Cited

U.S. PATENT DOCUMENTS

| | | |
|---|---|---|
| 9,624,592 B2 | 4/2017 | Abraham et al. |
| 2016/0190007 A1* | 6/2016 | Wang ...................... C25D 3/38 |
| | | 205/123 |
| 2016/0265132 A1 | 9/2016 | Graham et al. |
| 2017/0058417 A1 | 3/2017 | Graham et al. |
| 2017/0073805 A1* | 3/2017 | Gittleman ............ C23C 14/3485 |
| 2018/0106757 A1* | 4/2018 | Kosugi .................. G01N 27/42 |

OTHER PUBLICATIONS

Wang et al., A block copolymer as an effective additive for electrodepositing ultra-low Sn coatings, RSC Adavances, 2015, 5, pp. 83931-83935.*

Hazlebeck et al., Modeling of additive effects on the electroplating of a through-hole; AIChE Journal, vol. 36, No. 8, 1990, pp. 1145-1155.*

U.S. Appl. No. 15/225,716, filed Aug. 1, 2016, Thorkelsson et al.
U.S. Appl. No. 15/413,252, filed Jan. 23, 2017, Thorkelsson et al.
U.S. Appl. No. 15/455,011, filed Mar. 9, 2017, Graham et al.

* cited by examiner

CONVECTION OPTIMIZATION FOR MIXED FEATURE ELECTROPLATING

BACKGROUND

In integrated circuit manufacturing, a conductive material, such as copper, is often deposited by electroplating onto a conductive seed layer to fill one or more recessed features on the wafer substrate. Electroplating is a method of choice for depositing metal into the vias and trenches of the wafer during damascene processing, and is also used to fill through-silicon vias (TSVs), which are relatively large vertical electrical connections used in 3D integrated circuits and 3D packages. Electroplating may also be used to fill through resist wafer-level packaging (WLP) structures.

During electroplating, electrical contacts are made to the seed layer (typically at the periphery of the wafer), and the wafer is electrically biased to serve as a cathode. The wafer is brought into contact with an electroplating solution, which contains ions of a metal to be plated, and often includes additives that may promote certain fill behavior. Electroplating is typically conducted for an amount of time that is sufficient to fill the recessed features with metal. Then, the unwanted metal deposited on the field region of the wafer is removed in a planarization operation, such as by a chemical mechanical polishing (CMP).

SUMMARY

Various techniques described herein relate to methods, apparatus, and systems for electroplating material onto a substrate. Typically, at least one ultra-low convection stage is provided. This ultra-low convection stage may be paired with a moderate or high convection stage. The moderate or high convection stage may be provided at the beginning of the electroplating process and/or at the end of the electroplating process. In various embodiments, the substrate includes features of at least two different sizes (e.g., features having different critical dimensions and/or depths). The ultra-low convection stage can be used to target a desired relative deposition rate in the differently sized features, for example to fill the features in a uniform manner, or to target a particular gap height between the features after they are filled. Previously, it has been difficult or impossible to control the relative deposition rates in the differently shaped/sized features, particularly in certain embodiments as discussed further herein.

In one aspect of the disclosed embodiments, a method of electroplating material onto a substrate is provided, the method including: providing the substrate to an electroplating apparatus, where the substrate is a semiconductor substrate including a plurality of features recessed into a surface of the substrate; immersing the substrate in electrolyte in the electroplating apparatus; in a first stage, electroplating the material on to the substrate while flowing electrolyte within or through the electroplating apparatus to provide moderate or high convection conditions at the surface of the substrate; switching from the first stage to a second stage when a first switching condition is met; in the second stage, electroplating the material onto the substrate while flowing electrolyte within or through the electroplating apparatus to provide ultra-low convection conditions at the surface of the substrate, where at the ultra-low convection conditions, electrolyte flow proximate the surface of the substrate is laminar, and mass transport of metal ions in the electrolyte within the features is dominated by diffusion rather than convection over at least 75% of a depth of the features, and where the moderate or high convection conditions provide greater convection to the surface of the substrate compared to the ultra-low convection conditions; and removing the substrate from the electrolyte.

In certain implementations where high convection conditions are applied during the first stage, at the high convection conditions, either (i) electrolyte flow proximate the surface of the substrate is turbulent, and/or (ii) a velocity of electrolyte flow proximate the surface of the substrate is within about 10% of a velocity at which turbulence is achieved. In certain implementations where moderate convection conditions are applied during the first stage, at the moderate convection conditions mass transport of metal ions in the electrolyte within the features is dominated by diffusion rather than convection over about 50% or less of the depth of the features.

The first switching condition may be met when the electrolyte has sufficiently diffused into the features. In these or other cases, the first switching condition may be met when a current applied to the substrate is below a limiting current that will be experienced upon switching to the second stage. In these or other cases, the first switching condition may be met when organic plating additives including at least a suppressor are stabilized within the features. In certain implementations, the first switching condition may be met when: (a) the electrolyte has sufficiently diffused into the features, (b) a current applied to the substrate is below a limiting current that will be experienced upon switching to the second stage, and (c) organic plating additives including at least a suppressor are stabilized within the features.

In some embodiments, the method further includes switching from the second stage to a third stage when a second switching condition is met; and in the third stage, electroplating the material on to the substrate while flowing electrolyte within or through the electroplating apparatus to provide moderate or high convection conditions at the surface of the substrate. In some such cases, the features may include a first feature and a second feature, the first feature having a wider critical dimension compared to the second feature, the first and second features each having an instantaneous height as measured from a common reference plane, where the second switching condition is met when a difference between the instantaneous height of the second feature and the instantaneous height of the first feature reaches a target height gap. The target height gap may be at least about 0.5 μm, or at least about 1 μm in certain cases. In some cases, the critical dimension of the first feature may be at least about 20 μm wider than the second feature, and the target height gap may be at least about 2 μm. In various embodiments, the second switching condition takes into account a target within wafer non-uniformity for the substrate. As mentioned above, in various embodiments the features include a first feature and a second feature, where the first feature has a wider critical dimension compared to the second feature. The first feature may have a deeper depth compared to the first feature. In other cases, the first feature may have a shallower depth compared to the first feature. In still other cases, the first and second features may have the same depth.

In certain implementations, the features may be defined in a layer of photoresist, the method further including: after removing the substrate from the electrolyte, forming a cap layer on the material deposited in the features; after forming the cap layer, removing the photoresist from the surface of the substrate; and reflowing the cap layer. In some such cases, after the cap layer is reflowed, a height gap between the first feature and the second feature may be smaller than before the cap layer is reflowed, where the height gap is measured as a distance between an instantaneous height of the first feature and an instantaneous height of the second feature, as measured from a common reference plane. In some cases, before the cap layer is reflowed the height gap between the first feature and the second feature may be at least about 2 µm, and after the cap layer is reflowed, the height gap between the first feature and the second feature may be about 0.5 µm or less. For example, after the cap layer is reflowed, the height gap between the first feature and the second feature may be about 0.1 µm or less.

In another aspect of the disclosed embodiments, an apparatus is provided. The apparatus may be configured to perform any of the methods described herein. In some implementations, an apparatus for electroplating material onto a substrate includes: an electroplating chamber; a substrate support; and a controller configured to: cause a substrate to be provided to an electroplating apparatus, where the substrate is a semiconductor substrate including a plurality of features recessed into a surface of the substrate; cause the substrate to be immersed in electrolyte in the electroplating apparatus; in a first stage, cause the material to be electroplated on to the substrate while flowing electrolyte within or through the electroplating apparatus to provide moderate or high convection conditions at the surface of the substrate; switch from the first stage to a second stage when a first switching condition is met; in the second stage, causing the material to be electroplated onto the substrate while flowing electrolyte within or through the electroplating apparatus to provide ultra-low convection conditions at the surface of the substrate, where at the ultra-low convection conditions, electrolyte flow proximate the surface of the substrate is laminar, and mass transport of metal ions in the electrolyte within the features is dominated by diffusion rather than convection over at least 75% of a depth of the features, and where the moderate or high convection conditions provide greater convection to the surface of the substrate compared to the ultra-low convection conditions; and causing the substrate to be removed from the electrolyte.

These and other features will be described below with reference to the associated drawings.

DETAILED DESCRIPTION

Figure 1A:
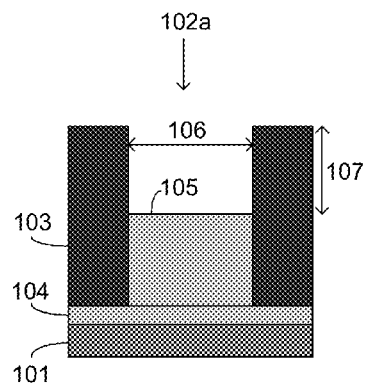
FIGS. 1A-1D illustrate a number of partially filled features on a substrate.

In this application, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry typically has a diameter of 200 mm, or 300 mm, or 450 mm. Further, the terms "electrolyte," "plating bath," "bath," and "plating solution" are used interchangeably. The following detailed description assumes the embodiments are implemented on a wafer. However, the embodiments are not so limited. The work piece may be of various shapes, sizes, and materials. In addition to semiconductor wafers, other work pieces that may take advantage of the disclosed embodiments include various articles such as printed circuit boards, magnetic recording media, magnetic recording sensors, mirrors, optical elements, micro-mechanical devices and the like.

In the following description, numerous specific details are set forth in order to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments. For instance, various embodiments herein are presented in the context of wafer-level packaging (WLP) applications. However, the concepts can be applied to many different electroplating applications. Similarly, a number of embodiments herein are presented in the context of copper electroplating, though the concepts can be applied to electroplating any metal. Other example metals that may be plated include tin, tin-silver alloys, nickel, gold, cobalt, and combinations of such metals.

In various electroplating applications, the convection conditions within the bulk electrolyte can have a substantial effect on electroplating results. Convection conditions within the bulk electrolyte may be especially relevant in cases where the features to be filled are relatively wide (e.g., having a critical dimensions of about 5-300 µm for WLP applications). In a number of embodiments herein, convection conditions within the electrolyte are tailored to achieve high quality electroplating results. In many cases, electroplating occurs using at least one ultra-low convection stage.

As used herein, the diffusion boundary distance ($\delta$) is defined as the distance from the feature surface (e.g., feature bottom) at which the metal ions in the electrolyte can be considered to be the bulk metal ion concentration in the electrolyte. The diffusion boundary distance is also known as the Nernst diffusion layer thickness. At distances greater than $\delta$, the metal ion concentration is estimated as the metal ion concentration in the bulk electrolyte. Conversely, at distances less than $\delta$, there is a diffusion gradient that can be estimated as a linearly decreasing concentration gradient, with the highest metal ion concentration being at δ and the lowest metal ion concentration being at the feature surface. This concentration gradient drives diffusion of metal ions to the substrate surface, into the features, where they are plated onto the substrate. Diffusion is the primary mechanism for transport of the metal ions at distances less than δ, dominating convection and migration effects.

The diffusion boundary distance, δ, can be approximated for a particular feature as a plane parallel to the surface of the feature, whereby an actual planar diffusion boundary would result in the same average metal ion concentration at the surface of the feature. In other words, the diffusion length varies over the surface of each feature due to variations in the convection profile and the resulting mass transport within the feature. For the purpose of simulation, a single diffusion boundary distance, δ, can be used for each feature, corresponding to the distance from the feature surface to a plane at full bath concentration that would result in the same average concentration of metal ions at the feature surface due to diffusion. The surface of the feature being considered is the bottom surface of the feature (rather than the sidewalls or field region). With these simplifications, the diffusion near the substrate can be estimated/treated as a 1D diffusion condition.

There are a number of factors that affect the plating rate within a feature. Such factors include, but are not limited to, the voltage applied at the feature surface (sometimes referred to as overpotential), temperature of electrolyte and substrate, concentration and identity of additives in electrolyte (e.g., accelerator, suppressor, leveler, etc.), metal ion concentration in electrolyte, convection conditions in electrolyte, etc. With all other factors being equal, the plating rate is proportional to the metal ion concentration at the surface of the feature. Typically, for smaller δ, the metal ion concentration at the surface of the feature is relatively higher, and for larger δ, the metal ion concentration at the surface of the feature is relative lower. The larger δ results in lower metal ion concentration at the feature surface because the larger δ provides a longer distance over which the metal ion concentration is linearly decreasing. The result is a higher plating rate at smaller δ, and vice versa.

This difference in plating rate can be problematic in cases where the substrate includes features of differing sizes. Different size features have different diffusion boundary distances. As such, where different sized features (having different δ) are provided near one another on a substrate, the feature with the smaller δ tends to plate faster. This difference in plating rate leads to poor uniformity of plated features (e.g., a high within-die non-uniformity). Within-die non-uniformity relates to the uniformity of features plated within a single die on a substrate. A single substrate typically includes many dies. A single die can include multiple feature sizes and/or shapes.

One conventional way to address the within-die non-uniformity arising from different feature sizes/shapes is to employ very high convection conditions. Higher convection conditions can be achieved by increasing the flow rate of electrolyte through the electroplating apparatus, mixing the electrolyte faster within the electroplating apparatus (e.g., using paddles, shear plates, etc.), moving (e.g., spinning) the substrate more quickly within the electrolyte, etc. These high convection conditions shrink the δ for most or all of the features, as metal ions are better able to diffuse toward the surface of the features. The high convection conditions have also been considered advantageous because such conditions promote a high plating rate, which results in high throughput. In a limiting case where convection is infinite, δ shrinks to zero for all features, and features of different sizes will all plate at the same rate. In practice, it is not possible to achieve infinite convection. Moreover, this method is less effective the deeper (e.g., higher aspect ratio) the features are formed in the substrate.

In the embodiments herein, a different approach is used to achieve an acceptable within-die non-uniformity in cases where the substrate includes multiple feature sizes. As opposed to using high convection conditions, the methods herein use an ultra-low convection stage. Unexpectedly, such methods have been shown to achieve improved within-die non-uniformity. These results were unexpected for at least the reasons described above, which have generally resulted in a move in the industry toward higher convection conditions for these applications (e.g., for uniformity reasons as well as throughput reasons). Moreover, the results were unexpected because previous research has shown that low convection plating stages (as opposed to an ultra-low convection plating stage as described herein), typically result in very poor plating results. By carefully tailoring the convection conditions over the course of an electroplating process using the techniques described herein, unexpectedly high quality plating results can be achieved, even for cases where the substrate includes different feature sizes within a single die.

As used herein, the term ultra-low convection refers to conditions where the electrolyte near the substrate exhibits laminar flow (or is effectively stagnant), and mass transport of the metal ions within the features on the substrate is dominated by diffusion rather than convection over at least 75% of the depth of the features. By contrast, the term high convection refers to conditions where the electrolyte near the substrate has a velocity very close to or exceeding the onset of turbulence (e.g., within about 10% of the velocity at which turbulent flow is achieved). The term moderate convection conditions refers to conditions where 50% or less of the feature is dominated by diffusion rather than convection, and the electrolyte near the substrate has a velocity at least 10% lower than the velocity at which turbulent flow is achieved. The term low convection conditions refers to conditions where about 50-75% of the feature is dominated by diffusion rather than convection.

During the ultra-low convection stage, the δ becomes relatively large for all of the different features, approaching the top of the feature (e.g., approaching the top of the photoresist in which the feature is defined). Although the overall plating rate during the ultra-low convection stage is lower than in high convection cases, the relative difference in δ among differently sized features can be reduced. For instance, features that start with a relatively larger δ may exhibit a smaller increase in δ, and features that start with a relatively smaller δ may exhibit a greater increase in δ, thereby evening out the δ among the different sized features. This reduction in the relative difference in δ among the differently sized features means that the differently sized features can plate at a more uniform rate during the ultra-low convection stage.

The ultra-low convection stage is particularly beneficial when used in combination with other convection conditions over the course of electroplating. By tailoring the convection conditions over the course of plating, high quality plating results can be achieved.

It is advantageous to include the ultra-low convection stage early in the electroplating process. Up to a certain extent, the earlier the ultra-low convection stage is initiated, the better the uniformity of the plated features. However, in some applications the ultra-low convection stage may begin after an initial plating stage where moderate or high convection conditions are used. This initial plating stage may be used to ensure that plating additives are properly dispersed into features (e.g., to promote a bottom-up fill mechanism), and/or to avoid problems related to limiting current. The limiting current is the maximum plating current that can be applied to the substrate under the relevant plating conditions. The limiting current arises because metal ions cannot be deposited on the substrate faster than they arrive at the surface of the substrate. Above the limiting current, the metal ions near the substrate surface become depleted, and there are insufficient metal ions to sustain the current applied to the substrate. As a result, unwanted side reactions such as evolution of hydrogen gas become problematic. Below the limiting current, there are sufficient metal ions near the substrate to sustain the current applied to the substrate, and the unwanted side reactions are minimized or avoided.

The limiting current changes over the course of an electroplating process. All other factors being equal, the limiting current tends to increase over the course of electroplating a single substrate. As such, the initial portion of the electroplating process is most sensitive to limiting current conditions (because the limiting current is lowest at this time). The convection conditions affect the value of the limiting current, with higher convection conditions corresponding to higher limiting current, and vice versa. As such, in order to avoid limiting current conditions during an initial stage of electroplating, ultra-low convection conditions may be avoided during the initial stage in some implementations. Instead, moderate or high convection conditions may be used during this time. This initial moderate or high convection stage may promote formation of a strong base for the plated features.

In some embodiments, a moderate or high convection stage may be used in a final portion of electroplating on a substrate. While the ultra-low convection conditions advantageously result in low within-die non-uniformity, these conditions also result in a lower overall plating rate. The lower overall plating rate reduces throughput because it takes longer to plate each substrate. The use of a moderate or high convection stage can increase the overall plating rate, thereby improving throughput. Moderate or high convection stages may also be beneficial for promoting certain types of uniformity (e.g., to reduce within-wafer non-uniformity arising from non-uniform photoresist deposition) that may suffer in cases where ultra-low convection is used for too long.

While it is not required to use a moderate or high convection stage in the disclosed embodiments, such stages can improve the electroplating results when used in combination with an ultra-low convection stage. The time(s) at which the convection conditions switch from one convection stage to another, as well as the order of the different stages, can also affect the electroplating results.

The optimal time for switching between an initial moderate or high convection stage and a later ultra-low convection stage is based on several considerations. For example, plating may switch from an initial moderate or high convection stage to an ultra-low convection stage when one or more of the following conditions is met: (1) the plating solution has sufficiently diffused into the features after immersion of the substrate; (2) the plating current is sufficiently below the limiting current of the ultra-low convection conditions; and/or (3) the plating additives have stabilized. In some cases, plating switches from the initial moderate or high convection stage to the ultra-low convection stage when any two of these conditions are met, or when all three of these conditions are met.

With respect to the diffusion of plating solution into the features after immersion of the substrate, this diffusion typically occurs over a period of about 1-10 seconds, depending on the dimensions of the features and the convection conditions present in the plating cell. Higher aspect ratio features typically result in longer diffusion timeframes. Greater convection conditions typically result in shorter diffusion timeframes.

With respect to the plating current, it is important to avoid exceeding the limiting current when the ultra-low convection conditions are applied. As described above, the limiting current is lower when ultra-low convection is used, as compared to higher convection conditions. The limiting current also increases with time as material plates within the features and the depth of the features decreases. In some cases, the current applied to the substrate may change between an initial moderate or high convection stage and a subsequent ultra-low convection stage. For instance, the magnitude of the plating current may decrease before or at the same time as the ultra-low convection conditions are applied. In other cases, the current applied to the substrate remains constant between the initial moderate or high convection stage and the subsequent ultra-low convection stage. Regardless of whether the applied current is uniform between these stages, it is important to ensure that the plating current applied to the substrate during the ultra-low convection stage is below the limiting current for that stage. In cases where the plating current is uniform between these stages, the determination of when to switch between the stages may be based on the plating current applied to the substrate toward the end of the initial moderate or high convection stage, in comparison to the limiting current of the ultra-low convection conditions. In one example, plating switches from an initial moderate or high convection stage to an ultra-low convection stage when the plating current is at or below about 50% of the limiting current for the ultra-low convection conditions. In another example, plating switches from an initial moderate or high convection stage to an ultra-low convection stage when the plating current is at or below about 90% of the limiting current for the ultra-low convection conditions. Where the 50% threshold is used, there is very little risk of encountering limiting current problems. Where the 90% threshold is used, the risk of encountering limiting current problems is greater, but acceptable.

With respect to stabilization of the plating additives, this typically occurs over a duration of about 0-5 minutes, depending on the identity of the plating additives and their related adsorption/desorption characteristics. This consideration is highly dependent on the exact chemistry that is used, as well as the material being plated.

The optimal time for switching from an ultra-low convection stage to a final moderate or high convection stage is also based on several considerations. In various cases, the optimal time for this switch is based on balancing certain performance tradeoffs. In some cases, this switching time is selected to optimize within die uniformity (WiD %), as explained in relation to FIG. 2 where multiple feature shapes/sizes are provided in a single die. Such uniformity is considered after a tin or tin-silver cap is plated and then reflowed over the different features. Because the solder will reflow differently over differently sized/shaped features, it may be desirable to plate each feature to different bump heights before deposition of the tin or tin-silver cap. The time at which plating switches from an ultra-low convection stage to a final moderate or high convection stage affects the relative bump heights for the different features.

In a particular example the substrate includes feature A and feature B. Feature A has a wider critical dimension than feature B. The plating conditions may be changed from an ultra-low convection stage to a final moderate or high convection stage when a specific height gap is achieved between the features. This height gap is measured as shown by element 211 in panels C and D of FIG. 2, and it is calculated as the height of feature B minus the height of feature A (as measured from a common reference plane). In cases where feature A is deeper than feature B, this height gap increases with time when the ultra-low convection conditions are applied. Conversely, in cases where feature A is shallower than feature B, the height gap decreases with time when the ultra-low convection conditions are applied. The behavior in the ultra-low convection regime contrasts with the behavior seen in the high convection regime. Specifically, where high convection conditions are used, the height gap always tends to decrease with time, making it difficult or impossible to target a desired height gap in various cases. In certain embodiments, the plating conditions are changed from the ultra-low convection stage to the final moderate or high convection stage when the gap height reaches a target gap height. Examples of target gap heights for different feature sizes and different tin or tin-silver cap thicknesses are provided below in Table 1.

TABLE 1

| CD of Feature A (µm) | CD of Feature B (µm) | Sn(Ag) Thickness Before Reflow (µm) | Target Gap Height (µm) |
|---|---|---|---|
| 60 | 40 | 10 | 1.5 |
| 60 | 50 | 10 | 0.6 |
| 50 | 30 | 10 | 2.3 |
| 50 | 40 | 10 | 0.9 |
| 40 | 20 | 10 | 3.5 |
| 40 | 30 | 10 | 1.4 |
| 60 | 40 | 15 | 2.9 |
| 60 | 50 | 15 | 1.3 |
| 50 | 30 | 15 | 4.0 |
| 50 | 40 | 15 | 1.7 |
| 40 | 20 | 15 | 5.5 |
| 40 | 30 | 15 | 2.3 |
| 60 | 40 | 15 | 4.2 |
| 60 | 50 | 20 | 1.9 |
| 50 | 30 | 20 | 5.4 |
| 50 | 40 | 20 | 2.4 |
| 40 | 20 | 20 | 7.2 |
| 40 | 30 | 20 | 3.1 |

It is expected that these target gap heights will result in uniform feature heights (e.g., between wider feature A and narrower feature B) after deposition and reflow of the tin or tin-silver solder cap. The critical dimensions listed in Table 1 relate to the diameters of circular features. For non-circular features, the target gap heights may shift compared to circular features having similar critical dimensions. The examples provided in Table 1 relate to current state of the art features used in semiconductor fabrication, but the embodiments are not so limited. The techniques described herein may be practiced with any feature sizes or combination of feature sizes.

Based on the examples in Table 1, in some embodiments feature A has a critical dimension that is at least about 10 µm wider than feature B, for example at least about 20 µm wider than feature B. In various cases, feature A has a critical dimension between about 5-30 µm wider than feature B, for example about 10-20 µm wider than feature B. In some cases, the critical dimension of feature B is between about 50-85% the critical dimension of feature A. In these or other cases, a tin or tin-silver solder cap may be provided at a thickness between about 5-30 µm, for example between about 10-20 µm. In these or other cases, the target gap height may be between about 0.5-10 µm, for example between about 1-8 µm, or between about 1-5 µm, or between about 1-3 µm. In particular cases, the target gap height may be between about 0.5-2 µm, between about 1-2 µm, between about 2-3 µm, between about 3-4 µm, between about 4-5 µm, between about 5-6 µm, between about 6-7 µm, between about 7-8 µm, etc. In certain examples, the critical dimension of feature A is about (or at least about) 20 µm wider than the critical dimension of feature B, and the target gap height is at least about 2.0 µm (in some cases between about 2.0-8.0 µm). As shown in Table 1, the optimal target gap height varies depending on the geometry of the various features and layers.

By using the target gap height to determine when to switch from the ultra-low convection stage to a final moderate or high convection stage, the within die non-uniformity is minimized/optimized. In certain cases, however, this focus on the target gap height and within die non-uniformity can result in unacceptably high within wafer non-uniformity. The within wafer non-uniformity is a measure of the non-uniformity between different dies on different portions of the substrate (e.g., a region where photoresist is thicker and the features are deeper, and a region where photoresist is thinner and the features are shallower). By contrast, the within die non-uniformity is a measure of the non-uniformity of features within a single die, which is positioned at a particular location on the substrate. As such, the target gap height may be used to determine when to switch from an ultra-low convection plating stage to a subsequent moderate or high convection stage in cases where the resulting within wafer non-uniformity is at an acceptable level. In cases where the within wafer non-uniformity would be unacceptably high (e.g., above about 5%) if the target gap height is considered, the determination of when to switch from the ultra-low convection stage to a subsequent moderate or high convection stage may instead be selected to achieve a target within wafer non-uniformity (e.g., <5%). This may result in switching to the moderate or high convection stage before the target gap height is reached. Higher convection conditions tend to improve within wafer non-uniformity.

The techniques described herein can be used in any electroplating application. However, the disclosed techniques are particularly advantageous in cases where any of the following conditions are met: (1) the substrate includes features having different critical dimensions but the same depth; (2) the substrate includes features having different critical dimensions, where the feature with the wider critical dimension is deeper than the feature with the narrower critical dimension; (3) the substrate includes features with different critical dimensions, where the feature with the wider critical dimension is shallower than the feature with the narrower critical dimension; (4) the substrate includes features having the same critical dimension, where one feature is deeper than the other; or (5) the substrate includes features that have one longer axis and one shorter axis (e.g., a feature that is oblong or rectangular), where certain features are oriented differently on the substrate.

In various applications, the substrate will include more than one size and/or shape of feature within a single die. In a number of embodiments, the features may have critical dimensions that range from about 5-300 µm, depths that range from about 5-300 µm, and depth:width aspect ratios between about 0.5:1-3:1. For applications related to plating through photoresist, typical critical dimensions between about 20-80 nm, and typical depth:width aspect ratios are between about 1:1 and 2:1. Feature openings are typically round, oblong, or rectangular (though any shape may be used). Before plating, the different features may be different depths or the same depth. In cases where the features start at different depths, the difference in depths is typically about 10 μm or less. Similarly, the different features may have different critical dimensions, or the same critical dimensions.

In certain embodiments, the substrate includes a first feature and a second feature in the same die, where the first and second features have different critical dimensions, depths, and/or shapes. In one embodiment, the first feature has a depth that is at least about 1.1× the depth of the second feature (e.g., the first feature having a depth of 50 μm and the second feature having a depth of at least about 55 μm). In some cases, the first feature has a depth that is at least about 1.5× the depth of the second feature. In these or other cases, the first feature may have a critical dimension that is at least about 1.5× the critical dimension of the second feature (or vice versa). In some such cases, the first feature may have a critical dimension that is at least about 2× the critical dimension of the second feature (or vice versa). In these or other cases, the first feature may have an aspect ratio (depth/width) that is at least about 1.5× the aspect ratio of the second feature (or vice versa). In some such cases, the first feature has an aspect ratio that is at least about 2× the aspect ratio of the second feature (or vice versa). In these or other cases, the first and second feature shapes may be rectangular or oblong (as viewed from above), where the longer dimension of the first feature is not aligned with the longer dimension of the second feature. In some cases the longer dimension of the first feature is perpendicular to the longer dimension of the second feature. In some other cases, the first feature is rectangular or oblong, and the second feature is square or circular.

FIG. 1A illustrates a partially filled feature 102a on a substrate 101. The feature 102a is defined within photoresist 103, which has been patterned to form the feature 102a. A seed layer 104 is provided over the substrate 101. The feature 102a is partially filled with plated metal 105. The critical dimension of the feature is labeled 106, the depth of the feature (after being partially filled, as shown) is labeled 107. It is understood that the depth of the feature is greater before plating occurs. The aspect ratio of the feature 102a is the depth 107 divided by the critical dimension 106.

Figure 1B:
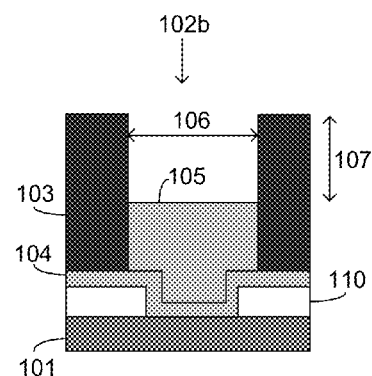
Figure 1C:
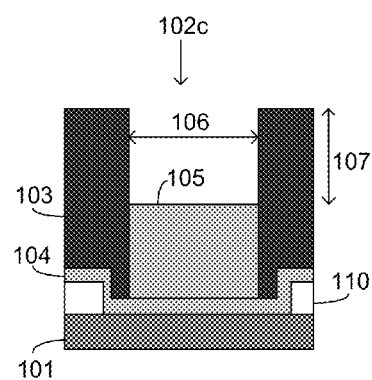
Figure 1D:
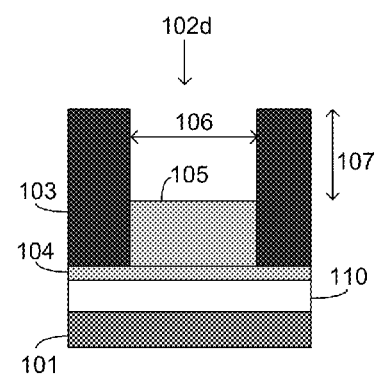

FIGS. 1B-1D illustrate additional example features 102b, 102c, and 102d, that may be used in some cases. These features differ from the one shown in FIG. 1A in that they include an electrically insulating material 110. This electrically insulating material may be, e.g., polyimide (PI) or photosensitive polyimide (PSPI). Also, the features shown in FIGS. 1B and 1C have a non-flat seed layer 104. The feature 102d shown in FIG. 1D has the electrically insulating material 110 across the entire bottom of the feature. The electrically insulating material 110 will electrically isolate the plated metal 105 in feature 102d after the photoresist and seed edge are removed in future processing. The feature 102d in FIG. 1D an example of a feature that may be used primarily for structural purposes, rather than electrical purposes, in a final device.

Figure 1E:
FIGS. 1E-1H show top-down views of a number of different features that may be formed on a substrate.
Figure 1F:
Figure 1G:
Figure 1H:

FIGS. 1E-1H illustrate top down views of different feature shapes. The feature in FIG. 1E is circular, the feature in FIG. 1F is ovoid, the feature in FIG. 1G is square, and the feature in FIG. 1H is rectangular.

It may be desirable to electroplate such that the resulting features (e.g., pillars) all have the same bump height after plating, as measured from a common reference plane. In some other cases, it may be desirable to electroplate such that relatively narrower features have a taller bump height after plating, as compared to relatively wider features. This difference in bump height may be advantageous because material subsequently deposited on the plated features (e.g., a tin or tin-silver cap) may reflow differently on differently sized features during later processing. For instance, a narrower SnAg cap on a narrower plated pillar will lose more height when the SnAg cap is reflowed compared to a wider SnAg cap on a wider plated pillar. Therefore, in order to achieve uniform heights after reflow of the SnAg caps, it is advantageous to ensure that the narrower feature is plated to a taller height than the wider feature. This result has been difficult or impossible to achieve using conventional electroplating techniques (especially in cases where the narrower feature is shallower than a wider/deeper feature), as the narrower features have typically plated at a lower rate than the wider features. However, the disclosed ultra-low convection plating stage described herein can be used to achieve this difficult and desirable result.

Figure 2:
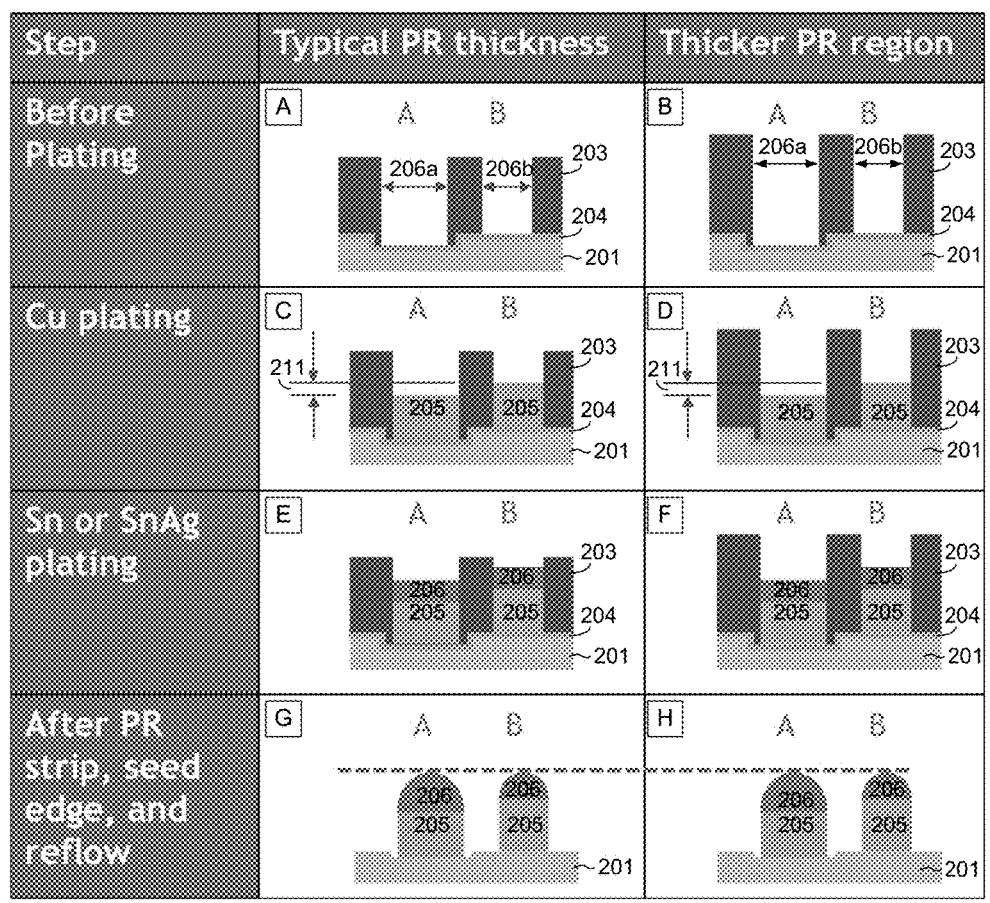
FIG. 2, panels A-H, depict two different features repeated at two different locations on a substrate as the features go through various stages of processing according to certain embodiments.

FIG. 2 illustrates features A and B as the features undergo various processing steps. FIG. 2 is provided to illustrate why it can be advantageous in certain embodiments to simultaneously plate narrower and wider features, where the narrower feature is plated to a taller bump height compared to the wider feature. In FIG. 2, features A and B are provided together on a single die. The die is repeated over the face of the substrate, including in a region with photoresist of a typical thickness, and in a region with relatively thicker (e.g., taller) photoresist. In the areas with thicker photoresist, the recessed features formed in the photoresist are relatively deeper, as compared to areas with thinner/typical photoresist. In FIG. 2, panels A, C, E, and G show the features in the die positioned in the region with typical photoresist thickness, while panels B, D, F, and H show the features in the die positioned in the region with the thicker photoresist. Feature A has critical dimension 206a, and feature B has critical dimension 206b. The critical dimensions 206a and 206b are different from one another, but are uniform between the different regions on the substrate (e.g., critical dimension 206a in panel A is the same as critical dimension 206a in panel B).

As shown in panels A and B, before electroplating the substrate 201 includes a seed layer 204 thereon, and a patterned layer of photoresist 203. The photoresist 203 defines the recessed features that are to be filled. In this example, feature A is wider and deeper than feature B. As shown in panels C and D, after electroplating copper 205 into the features, there is a height gap 211. This height gap 211 represents the difference in height between features A and B, as measured from a common reference plane. The height gap 211, where implemented, should be uniform between the different regions on the substrate (e.g., height gap 211 in panel C may be the same as height gap 211 in panel D). As mentioned above, this height gap 211 has been difficult or impossible to achieve in many cases using conventional plating techniques. However, by including an ultra-low convection stage as described herein, such a height gap 211 can be realized.

After the copper 205 is electroplated into the features, a tin or tin-silver material 206 is deposited over the copper 205, as shown in panels E and F. The tin or tin-silver material 206 may form a cap on the copper 205. The tin or tin-silver material 206 may be deposited using conventional techniques in some cases. In other cases, the tin or tin-silver material 206 may be deposited using the techniques described herein, for example by including an ultra-low convection stage. The height gap 211 may be substantially maintained during deposition of the tin or tin-silver material 206 (although it may shrink or grow in some cases). After deposition of the tin or tin-silver material 206, the substrate undergoes a variety of processing steps to strip away the photoresist, clean away the seed edge, and reflow the tin or tin-silver material 206. After reflowing, the tin or tin-silver material 206 has a dome shape, as shown in panels G and H. As described above, narrower feature B reflows/shrinks to a greater degree than wider feature A. Because feature B was initially plated with copper 205 to a taller bump height than feature A (using a common reference plane), the features A and B are of uniform bump height after the reflowing operation. This uniform bump height is the same across all regions of the substrate, as shown by the dotted line that extends from panel G to panel H. In various embodiments, there may be layers of other metals or other materials provided between the copper 205 and the tin or tin-silver material 206. For example, nickel is commonly used in between such layers. In certain examples, the feature includes a stack having, in order, copper/nickel/tin, or copper/nickel/tin-silver. In another embodiment, an additional layer of copper may be provided. In some such embodiments, the feature includes a stack having, in order, copper/nickel/copper/tin, or copper/nickel/copper/tin-silver.

In many cases, a final within-die non-uniformity may be calculated for a particular substrate after the reflow operation (e.g., when the substrate is as shown in panels G and H). At this point, it is desirable for all of the features to be a uniform bump height, as measured from a common reference plane.

In certain embodiments, it may be advantageous to vary the current and/or potential applied to the substrate over the course of electroplating. In some cases, the substrate may be immersed at a constant potential (e.g., between the substrate and a reference electrode). In some other cases, the substrate may be immersed at a constant current or constant current density. In some cases, the current or current density may ramp up (continuously or step-wise) as the substrate is immersed. In some cases, the substrate may be immersed without application of current or potential to the substrate. Substrate immersion is further discussed in U.S. Pat. Nos. 6,793,796, and 9,385,035, each of which is herein incorporated by reference in its entirety.

After the substrate is immersed, the current and/or potential applied to the substrate may change. In many cases, the substrate may be electroplated at a constant current density or constant potential. In some cases, the substrate may be electroplated at a first current density or potential, then a second current density or potential, etc., with different current densities/potentials being applied in different stages of plating.

The current and/or potential applied to the substrate during plating may be varied independently of the convection conditions. In some cases, however, the current and/or potential may be varied in conjunction with the convection conditions. In such cases, the current and/or potential applied to the substrate changes at the same time that the convection conditions change.

Figure 3A:
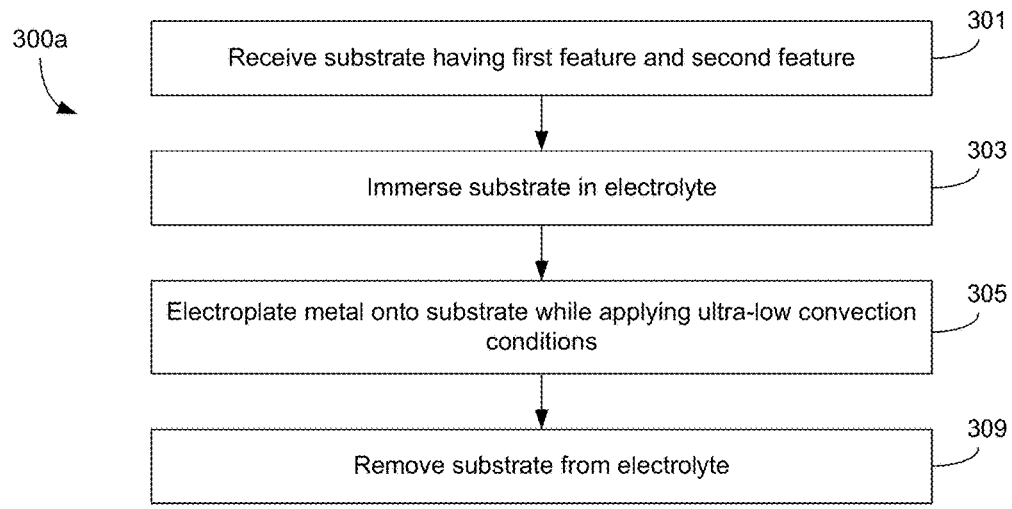
FIGS. 3A-3C are flowcharts depicting methods of electroplating using at least one stage of ultra-low convection conditions according to certain embodiments.
Figure 3B:
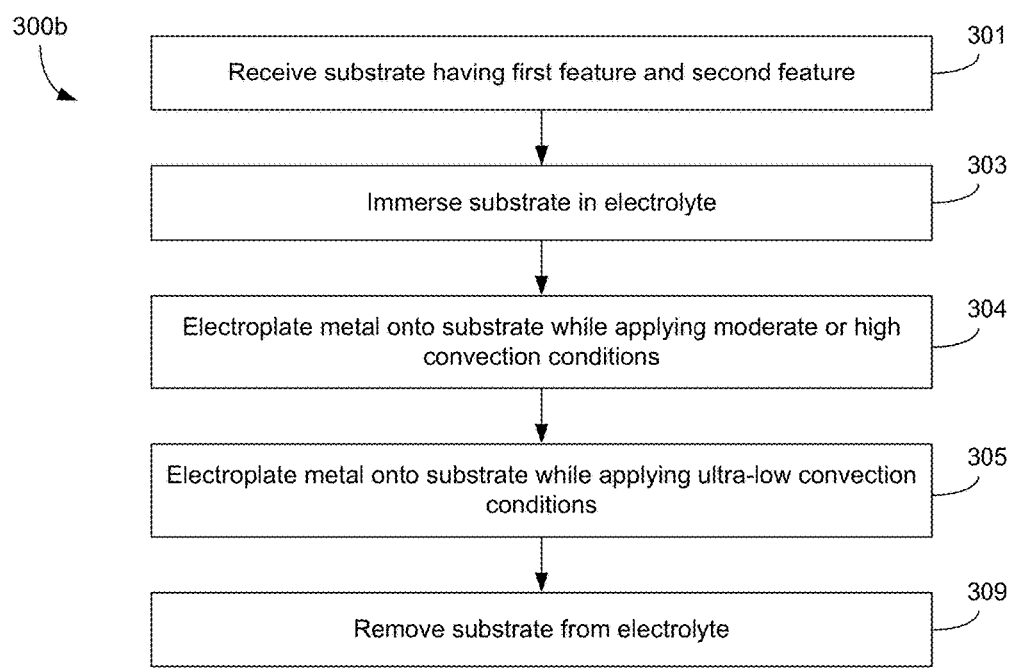
Figure 3C:
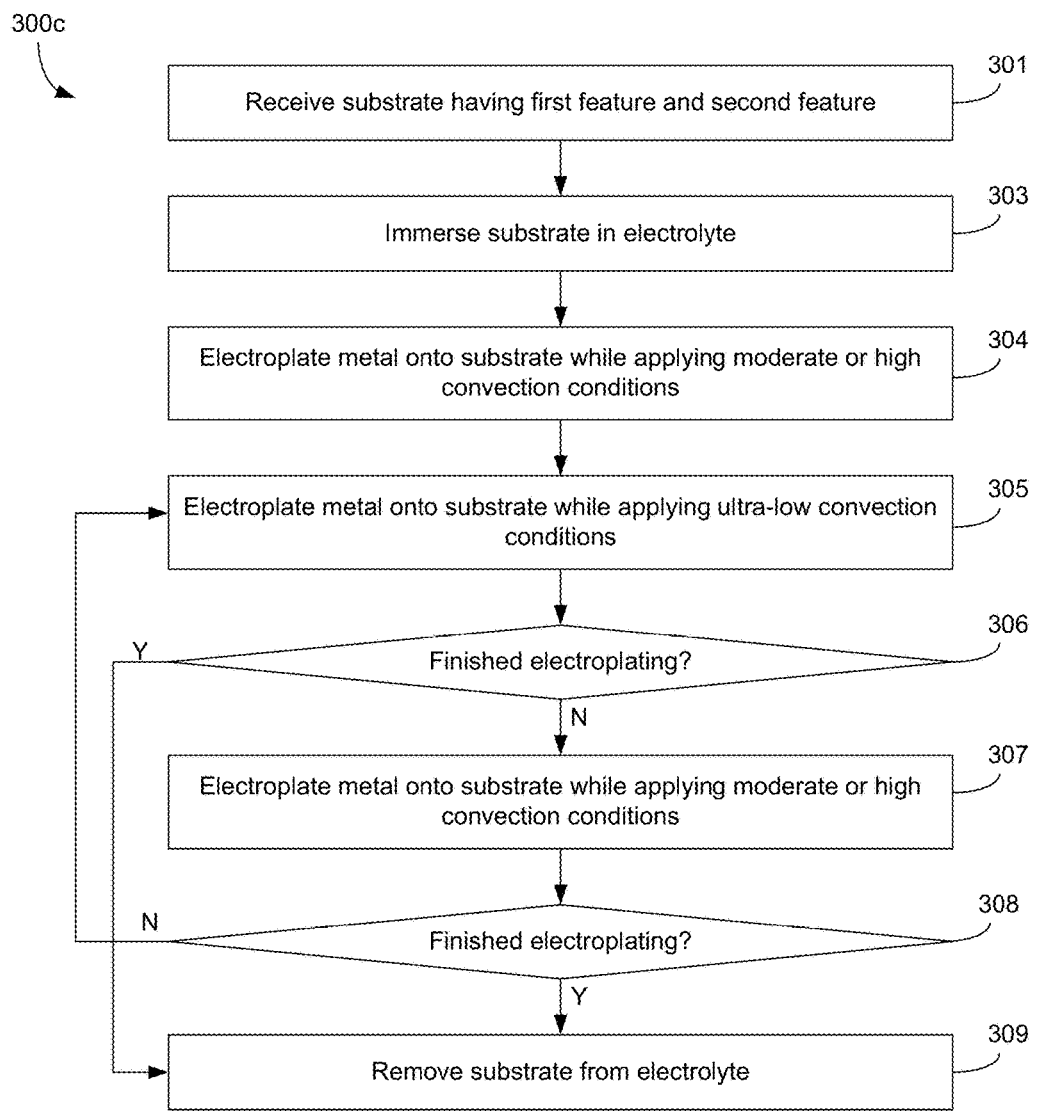

FIGS. 3A-3C show flowcharts depicting methods of electroplating using the low convection techniques described herein. The method 300a of FIG. 3A is the simplest method. Method 300a begins with operation 301, where a substrate having a first feature and a second feature is received in an electroplating apparatus. The first feature and second feature are different from one another, e.g., having different critical dimensions and/or depths as described above. The first and second feature may be provided together in a single die. The die may be repeated over the surface of the substrate. Next, at operation 303 the substrate is immersed in electrolyte. The substrate may or may not be rotated during immersion. Any convection conditions may be used during immersion. In a particular example, moderate or high convection conditions are used during immersion. In another example, ultra-low convection conditions are used during immersion. As mentioned above, the substrate may or may not be polarized during immersion, e.g., with a constant potential or constant current or current density in some cases.

At operation 305, metal is electroplated on to the substrate while ultra-low convection conditions are applied. This is the ultra-low convection stage. A number of different factors affect the convection conditions, as described above. For instance, the flow rate of electrolyte through the electroplating cell, the rotation rate of the substrate, the rate at which a mixer in the electrolyte spins/moves, and the temperature of the electrolyte and/or substrate can all affect the convection conditions. Some of these factors (e.g., rotation rate) may be easier to control/modulate than others (e.g., temperature of electrolyte).

During the ultra-low convection stage, the diffusion boundary distance, δ, is relatively large for both the first and second feature. In some cases, δ may approach the height of the photoresist, allowing δ to become relatively uniform for the first and second features. As a result, the first and second features plate at a substantially uniform rate. This is particularly true if the first and second features are at similar depths. By contrast, in cases where the first and second features have different depths (and particularly in cases where the feature with the wider critical dimension deeper than the feature with the narrower critical dimension), δ can become smaller on the narrower feature, which promotes faster plating within the narrower feature compared to the wider feature. This phenomenon has been difficult or impossible to achieve using other methods. Next, at operation 309, the substrate is removed from electrolyte and the method 300a is complete.

The method 300b shown in FIG. 3B is similar to the method 300a in FIG. 3A, and for the sake of brevity only the differences will be discussed. After the substrate is immersed at operation 303, method 300b continues with operation 304, where metal is electroplated onto the substrate while moderate or high convection conditions are applied. This initial moderate or high convection stage may be useful for establishing bottom-up fill, ensuring that electroplating additives are dispersed into features appropriately, depositing metal while the limiting current is especially low, etc. After the moderate or high convection conditions are applied in operation 304, the method continues with operation 305, where ultra-low convection conditions are applied. The remaining aspects of the method 300b of FIG. 3B are similar to those described in relation to the method 300a of FIG. 3A.

The method 300c of FIG. 3C is similar to the method 300b of FIG. 3B. For the sake of brevity, only the differences will be described. After the ultra-low convection conditions are applied in operation 305, it may be determined whether the electroplating process is complete. If yes, the method continues with operation 309 where the substrate is removed from electrolyte. In this case, the method 300c simplifies to the method 300b of FIG. 3B. In cases where electroplating is not yet complete at operation 306, the method 300c continues with operation 307, where moderate or high convection conditions are applied. The convection conditions may be the same or different from those applied during operation 304. In some cases, the moderate or high convection conditions applied during operation 307 may counteract certain within-wafer non-uniformities that may arise as a result of non-uniform photoresist deposition. Moreover, the moderate or high convection conditions applied during operation 307 may increase throughput, as compared to a process that proceeds without such an operation.

Next, at operation 308, it may be determined whether the electroplating process is complete. If yes, the method continues with operation 309, where the substrate is removed from the electrolyte. If plating is not yet complete, the method 300c continues at operation 305, where ultra-low convection conditions are again applied while metal is electroplated onto the substrate. The ultra-low convection conditions and the moderate or high convection conditions applied in operations 305 and 307, respectively, may be repeated until the electroplating is complete and the substrate is removed from electrolyte.

In a particular example, the method 300c involves an initial moderate or high convection stage (operation 304), a single ultra-low convection stage (operation 305), and a final moderate or high convection stage (operation 307). In another example, the method 300c involves an initial moderate or high convection stage (operation 304), multiple ultra-low convection stages (operation 305), and multiple moderate or high convection stages (operation 307) that occur between repeated ultra-low convection stages. The convection stages may be repeated/cycled any number of times. In another example, operation 304 of method 300c may be omitted, such that the ultra-low convection conditions are applied during or just after immersion.

As mentioned above, in some cases the current applied to the substrate may be varied over the course of electroplating. In one example, methods 300b or 300c involve applying relatively lower current to the substrate during the ultra-low convection stage in operation 305, and applying relatively higher current to the substrate during the moderate or high convection stage in operations 304 and/or 307. In a particular example, method 300c involves applying relatively low current to the substrate during the initial moderate or high convection stage in operation 304 (e.g., while the limiting current is relatively low), applying relatively low current to the substrate during the ultra-low convection stage in operation 305, and applying relatively higher current to the substrate during the moderate or high convection stage in operation 307.

In some embodiments, the current may be slowly increased over time during the ultra-low convection stage. The current may be controlled to stay near but below the limiting current. In one example, the applied current is controlled to be between about 85-95% (e.g., about 90% in some cases) of the instantaneous limiting current during the ultra-low convection stage. As the plating progresses and the features become shallower, the limiting current increases, as does the applied current.

[Inventors—anything specific to add regarding modulation of current/potential? Maybe a few specific examples for different combinations of feature types?]

Figure 4A:
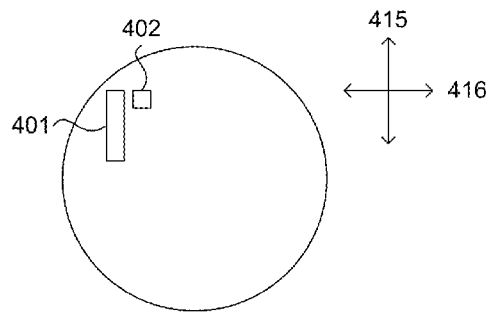
FIGS. 4A-4F depict example combinations of different features that may be provided on a substrate according to certain embodiments, where the features are oriented differently from one another.
Figure 4B:
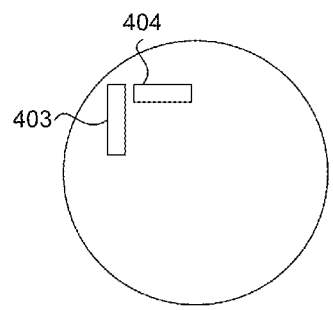
Figure 4C:
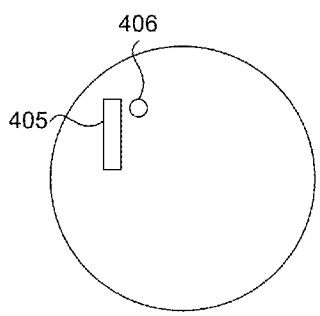
Figure 4D:
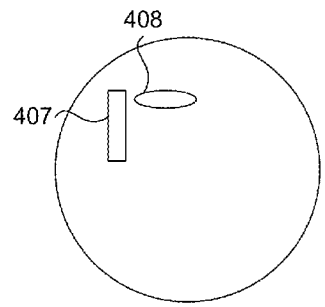
Figure 4E:
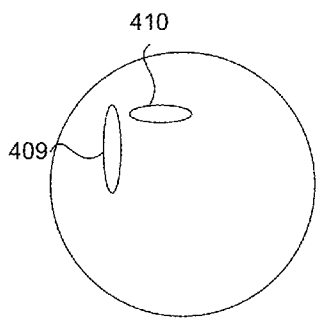
Figure 4F:
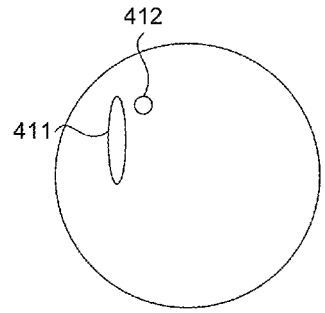

In one implementation, the first and second features are oriented differently, and the convection conditions are varied with time in order to affect the different features differently. FIGS. 4A-4F show top-down views of substrates having different pairs of features that are exaggerated in size for the purpose of illustration. Specifically, FIGS. 4A-4F show a number of examples where the first and second features are oriented differently on the substrate. The lines 415 and 416 are provided for the purpose of describing the orientation of the various features. In FIG. 4A, the first feature 401 is rectangular and the second feature 402 is square. The first feature 401 is oriented with its longer axis pointing along line 415. In FIG. 4B, the first feature 403 and second feature 404 are both rectangles, where the first feature 403 is oriented with its longer axis pointing along line 415 and the second feature 404 is oriented with its longer axis pointing along line 416. In this example, the features 403 and 404 are oriented perpendicular to one another. In FIG. 4C, the first feature 405 is a rectangle oriented with its longer axis along line 415, and the second feature 406 is a circle. In FIG. 4D, the first feature 407 is a rectangle with its longer axis pointing along line 415 and the second feature 408 is an ovoid with its longer axis pointing along line 416, perpendicular to the first feature 407. In FIG. 4E, the first feature 409 and second feature 410 are both ovoids, where the first feature 409 is oriented with its longer axis pointing along line 415 and the second feature 410 is oriented with its longer axis pointing along line 416, perpendicular to the first feature 409. In FIG. 4F, the first feature 411 is an ovoid with its longer axis pointing along line 415, and the second feature 412 is a circle. These combinations of features are provided as examples and are not intended to be limiting. Any combination of feature shapes and orientations may benefit from the techniques described herein.

In cases where the substrate is rotated while electroplating, the convection conditions can be modulated in time with the substrate rotation in order to favor deposition in one feature over another feature. The different orientations of the features, as well as a directional flow through the electroplating cell, may contribute to this result. In cases where the flow through the electroplating cell has a directional cross flow component (e.g., flowing electrolyte from an inlet side to an outlet side, where the inlet side and outlet side are positioned proximate azimuthally opposed perimeter locations on the substrate such that electrolyte flows along the plating face of the substrate in a shearing manner), the convection conditions can be modulated such that relatively lower convection conditions (in some cases ultra-low convection conditions as described above) are applied when the features are in a first position with respect to the cross flow, and relatively higher convection conditions (e.g., moderate or high convection conditions) are applied when the features are in a second position with respect to the cross flow. Electroplating cells having directional cross flow are further described in the following US Patents and Patent Applications, each of which is herein incorporated by reference: U.S. Pat. No. 9,624,592, titled "CROSS FLOW MANIFOLD FOR ELECTROPLATING APPARATUS"; U.S. patent application Ser. No. 14/924,124, filed Oct. 27, 2015, and titled "EDGE FLOW ELEMENT FOR ELECTROPLATING APPARATUS"; U.S. patent application Ser. No. 15/161,081, filed May 20, 2016, and titled "DYNAMIC MODULATION OF CROSS FLOW MANIFOLD DURING ELECTROPLATING"; U.S. patent application Ser. No. 15/225,716, filed Aug. 1, 2016, and titled "DYNAMIC MODULATION OF CROSS FLOW MANIFOLD DURING ELECTROPLATING"; U.S. patent application Ser. No. 15/413,252, filed Jan. 23, 2017, and titled "MODULATION OF APPLIED CURRENT DURING SEALED ROTATIONAL ELECTROPLATING."

Figure 5A:
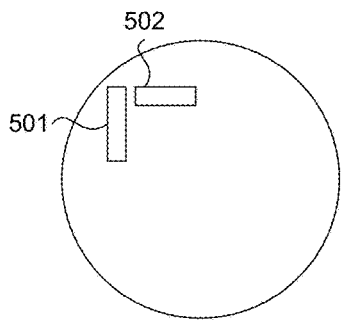
FIGS. 5A-5D show a substrate with two different features thereon as the substrate rotates through different positions during electroplating.
Figure 5B:
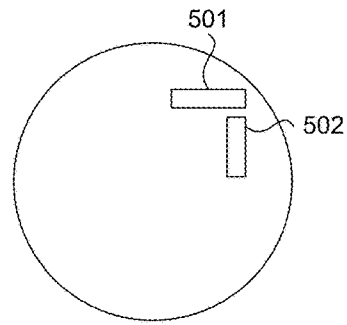

One example is described in relation to FIGS. 5A-5D. FIGS. 5A-5D illustrate a substrate having a first feature 501 and a second feature 502, where the first and second features 501 and 502 are rectangularly shaped and oriented perpendicular to one another. The line 516 indicates the direction of cross flowing electrolyte across the plating face of the substrate. In FIG. 5A the substrate is in a first orientation, in FIG. 5B the substrate is in a second orientation that is rotated 90° clockwise from the first orientation, in FIG. 5C the substrate is in a third orientation that is rotated 90° clockwise from the second orientation, and in FIG. 5D the substrate is in a fourth orientation that is rotated 90° clockwise from the third orientation. The substrate may be rotated through the different orientations shown in FIGS. 5A-5D as the electroplating process proceeds.

Figure 5C:
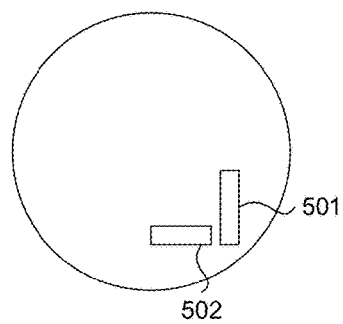
Figure 5D:
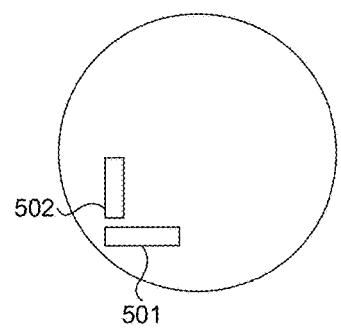

When the substrate is in the first and third orientations as shown in FIGS. 5A and 5C, respectively, the electrolyte cross flow is aligned with the longer axis of the second feature 502, perpendicular to the longer axis of the first feature 501. In these orientations, the convection conditions preferentially affect the diffusion boundary distance, δ, for the second feature 502 compared to the first feature 501. By contrast, when the substrate is in the second and fourth orientations shown in FIGS. 5B and 5D, respectively, the electrolyte cross flow is aligned with the longer axis of the first feature 501, perpendicular to the longer axis of the second feature 502. In these orientations, the convection conditions preferentially affect δ for the first feature 501 compared to the second feature 502.

In various examples, the convection conditions are modulated as the substrate rotates through different orientations in order to favor deposition in one feature over another. In one example, ultra-low convection conditions are applied when the substrate is in the first and third orientations shown in FIGS. 5A and 5C, respectively, and moderate or high convection conditions are applied when the substrate is in the second and fourth orientations shown in FIGS. 5B and 5D, respectively. The ultra-low convection conditions increase δ within the features, though the δ within the second feature 502 is increased to a greater degree than δ within the first feature 501 because the electrolyte cross flow is aligned with the longer axis of the second feature 502 when the ultra-low convection conditions are applied. The increased δ slows plating overall, and results in preferentially slowed plating within the second feature 502 compared to the first feature 501. By contrast, the moderate or high convection conditions lower δ within the features, though the δ within the first feature 501 is lowered to a greater degree than δ within the second feature 502 because the electrolyte cross flow is aligned with the longer axis of the first feature 501 when the moderate or high convection conditions are applied. The lower δ increases the overall plating rate, and preferentially increases the plating rate within the first feature 501 compared to the second feature 502. As the substrate rotates and the convection conditions are cycled, these effects combine to result in a relatively higher plating rate within the first feature 501 and a relatively lower plating rate within the second feature 502. These effects can be applied to any combination of features, including but not limited to the features shown in FIGS. 4A-4F.

In some cases, this same technique can be used to result in more uniform bump height, as measured from a common reference plane, across features that started at different depths and/or critical dimensions (as compared to cases where the convection conditions are not modulated with substrate rotation). For instance, if an electroplating process on a particular substrate results in an uneven bump height between two features having different initial depths and/or critical dimensions, the electroplating process may be modified to modulate the convection conditions in time with substrate rotation to favor deposition in the feature that would otherwise be underplated. This same technique can be used to achieve a particular desired height gap between the plated metal in one feature and the plated metal in another feature. This may be desirable for the reasons described above in relation to FIG. 2, for instance.

In cases where convection conditions are modulated with substrate rotation, it may be beneficial to choose a method of modulating convection conditions that affects the conditions relatively quickly. One simple way to quickly modulate the convection conditions is to raise and/or lower (or stop) the flow rate of electrolyte through the electroplating cell. Higher rates of electrolyte flow correspond to more substantial convection conditions. Another way to modulate convection conditions is to increase and/or decrease the rate or frequency at which the substrate rotates, or the rate or frequency at which a spinner/paddle/mixer/shear plate within the electroplating cell rotates. Similarly, in cases where convection is caused by a paddle, shear plate, or similar mixing mechanism, the convection conditions can be affected by the distance between the mixing mechanism and the substrate. Generally, longer distances between the substrate and the mixing mechanism result in lower convection, and vice versa. Another method for modulating convection conditions is to modulate the relevant geometric dimensions of the electroplating apparatus. In some examples where the electrolyte flows through a narrow gap (e.g., between the substrate and an ionically resistive element), changing the dimensions of the gap affects the convection conditions. Specifically, increasing the height of the gap results in a lower shear velocity/relatively lower convection conditions at the substrate surface (assuming a constant electrolyte flow rate through the gap). Conversely, decreasing the height of the gap raises the shear velocity of the electrolyte near the substrate, thereby providing relatively greater convection conditions (assuming a constant electrolyte flow rate through the gap). An example apparatus that utilizes electrolyte flow through such a gap is described in relation to FIG. 8. Other methods for modulating convection conditions are described above.

Experimental

Figure 6A:
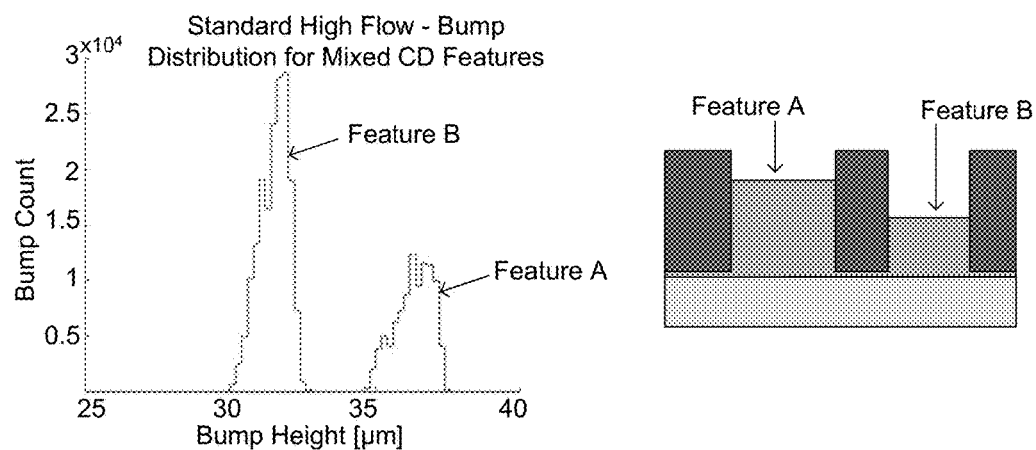
FIGS. 6A and 6B depict mixed CD features and experimental results showing the bump height distribution for the mixed CD features in a case where standard high convection is used (FIG. 6A) and in a case where mixed convection is used as described herein (FIG. 6B).
Figure 6B:
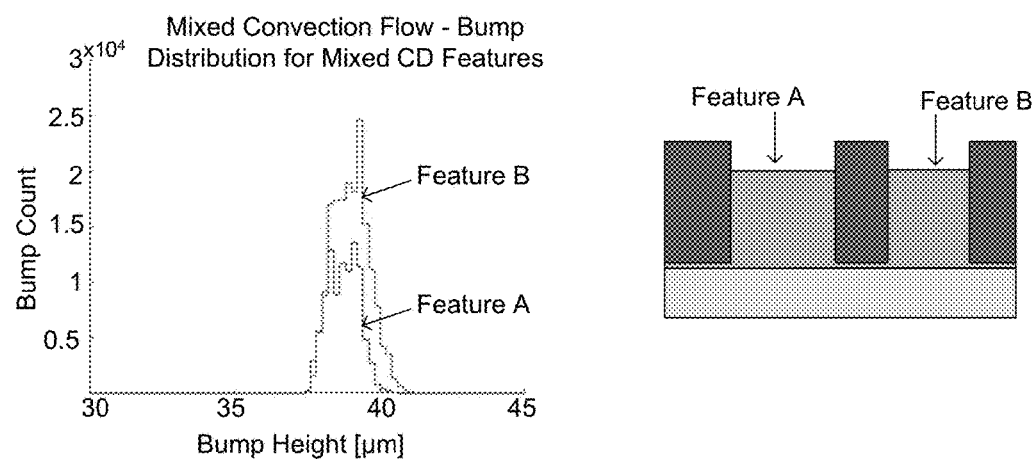

FIGS. 6A and 6B together illustrate certain advantages of the disclosed ultra-low convection electroplating techniques. Each of these figures shows the bump height distribution achieved on a tested substrate. Each figure also depicts a cross-sectional view of example features after electroplating. The tested substrates included two different feature sizes. Feature A was an oblong feature having an opening of about 45 μm×55 μm, and feature B was an oblong feature having an opening of about 30 μm×40 μm. Features A and B were both about 50 μm deep before plating.

FIG. 6A shows the bump height distribution for a substrate plated in convectional high convection conditions. The two features plated to different bump heights, with wider feature A plating to a taller bump height compared to narrower feature B. FIG. 6B shows the bump height distribution for a substrate plated using the mixed convection techniques described herein, including an ultra-low convection stage. In this case, features A and B plated to the same bump height, as shown by the large overlap in the bump height distribution. In this example, the ultra-low convection conditions slowed down the deposition in feature A relative to feature B such that the deposition rate within features A and B was more uniform (compared to the case where only high convection was used). While the ultra-low convection conditions may slow the plating rate in both features, such conditions have a more pronounced effect on the wider feature, allowing the relative deposition rates to be tuned to achieve a desired relative fill rate and bump height for differently sized features. This result was not previously achievable using conventional plating techniques.

The plating results shown in FIGS. 6A and 6B relate to copper electroplating. While these figures show that the ultra-low convection plating methods can be used to achieve a uniform bump height between differently sized features, it is understood that these same methods can be used to target a particular desired height gap between the different features, for example as described in relation to FIG. 2. This may be achieved by controlling the convection conditions and the time at which the convection conditions are changed. In such cases, it may be desirable to ensure that feature B is taller than feature A by a particular height gap at the end of the copper electroplating. A tin or tin-silver cap layer may then be deposited on the copper layer, which is then reflowed after the photoresist is removed. Because the differently sized features will reflow the cap layer to different degrees, the targeted gap height can ensure that the features are the same height after the cap layer is reflowed.

Apparatus

The methods described herein may be performed by any suitable apparatus. A suitable apparatus includes hardware for accomplishing the process operations and a system controller having instructions for controlling process operations in accordance with the present embodiments. For example, in some embodiments, the hardware may include one or more process stations included in a process tool.

Figure 7:
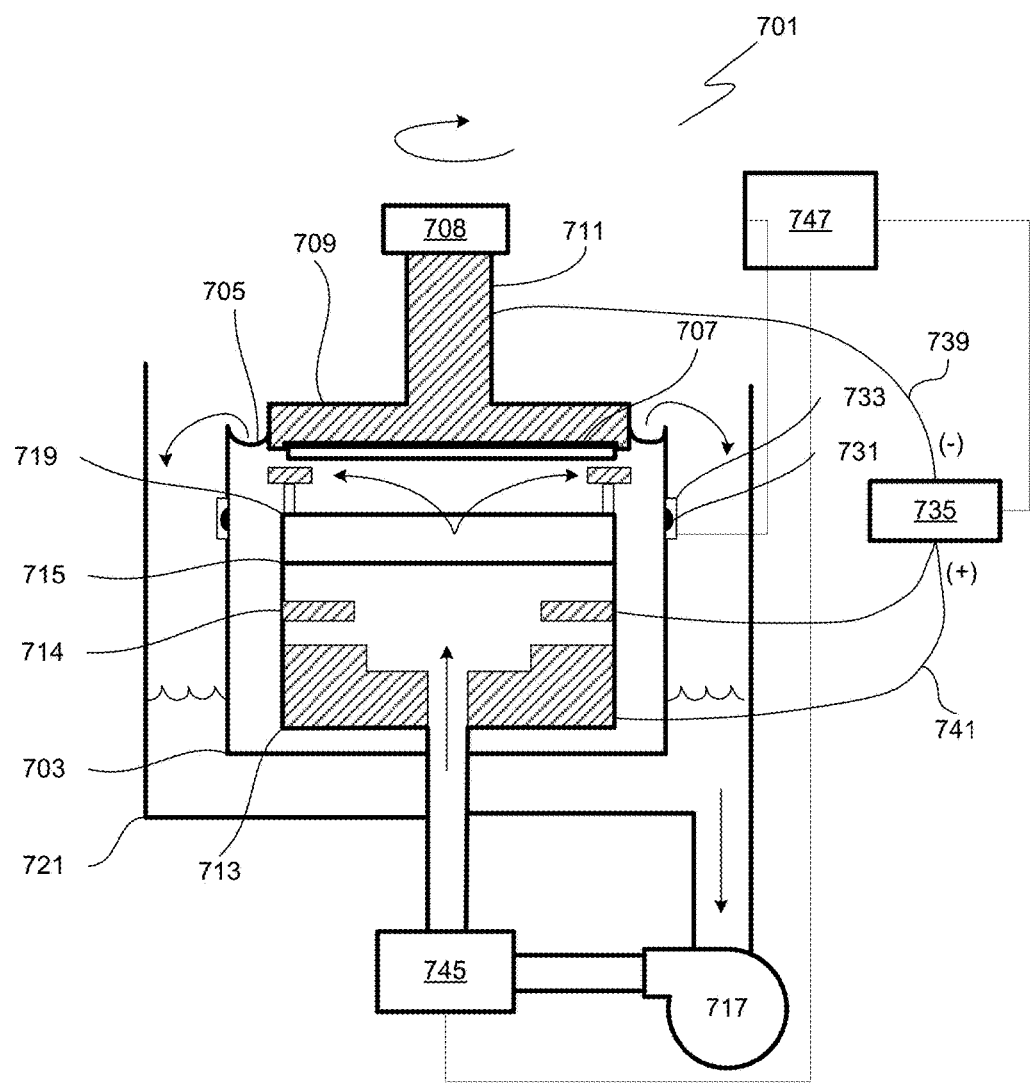
FIGS. 7 and 8 depict simplified views of electroplating cells according to certain embodiments.

FIG. 7 presents an example of an electroplating cell in which electroplating may occur. Often, an electroplating apparatus includes one or more electroplating cells in which the substrates (e.g., wafers) are processed. Only one electroplating cell is shown in FIG. 7 to preserve clarity. To optimize bottom-up electroplating, additives (e.g., accelerators, suppressors, and levelers) are added to the electrolyte; however, an electrolyte with additives may react with the anode in undesirable ways. Therefore anodic and cathodic regions of the plating cell are sometimes separated by a membrane so that plating solutions of different composition may be used in each region. Plating solution in the cathodic region is called catholyte; and in the anodic region, anolyte. A number of engineering designs can be used in order to introduce anolyte and catholyte into the plating apparatus.

Referring to FIG. 7, a diagrammatical cross-sectional view of an electroplating apparatus 701 in accordance with one embodiment is shown. The plating bath 703 contains the plating solution (having a composition as provided herein), which is shown at a level 705. The catholyte portion of this vessel is adapted for receiving substrates in a catholyte. A wafer 707 is immersed into the plating solution and is held by, e.g., a "clamshell" substrate holder 709, mounted on a rotatable spindle 711, which allows rotation of clamshell substrate holder 709 together with the wafer 707. A general description of a clamshell-type plating apparatus having aspects suitable for use with this invention is described in detail in U.S. Pat. No. 6,156,167 issued to Patton et al., and U.S. Pat. No. 6,800,187 issued to Reid et al., which are incorporated herein by reference in their entireties.

An anode 713 is disposed below the wafer within the plating bath 703 and is separated from the wafer region by a membrane 715, preferably an ion selective membrane. For example, Nafion™ cationic exchange membrane (CEM) may be used. The region below the anodic membrane is often referred to as an "anode chamber." The ion-selective anode membrane 715 allows ionic communication between the anodic and cathodic regions of the plating cell, while preventing the particles generated at the anode from entering the proximity of the wafer and contaminating it. The anode membrane is also useful in redistributing current flow during the plating process and thereby improving the plating uniformity. Detailed descriptions of suitable anodic membranes are provided in U.S. Pat. Nos. 6,126,798 and 6,569,299 issued to Reid et al., both incorporated herein by reference in their entireties. Ion exchange membranes, such as cationic exchange membranes, are especially suitable for these applications. These membranes are typically made of ionomeric materials, such as perfluorinated co-polymers containing sulfonic groups (e.g. Nafion™), sulfonated polyimides, and other materials known to those of skill in the art to be suitable for cation exchange. Selected examples of suitable Nafion™ membranes include N324 and N424 membranes available from Dupont de Nemours Co.

During plating the ions from the plating solution are deposited on the substrate. The metal ions must diffuse through the diffusion boundary layer and into the TSV hole or other feature. A typical way to assist the diffusion is through convection flow of the electroplating solution provided by the pump 717. Additionally, a vibration agitation or sonic agitation member may be used as well as wafer rotation. For example, a vibration transducer 708 may be attached to the clamshell substrate holder 709.

The plating solution is continuously provided to plating bath 703 by the pump 717. Generally, the plating solution flows upwards through an anode membrane 715 and a diffuser plate 719 to the center of wafer 707 and then radially outward and across wafer 707. The plating solution also may be provided into the anodic region of the bath from the side of the plating bath 703. The plating solution then overflows plating bath 703 to an overflow reservoir 721. The plating solution is then filtered (not shown) and returned to pump 717 completing the recirculation of the plating solution. In certain configurations of the plating cell, a distinct electrolyte is circulated through the portion of the plating cell in which the anode is contained while mixing with the main plating solution is prevented using sparingly permeable membranes or ion selective membranes.

A reference electrode 731 is located on the outside of the plating bath 703 in a separate chamber 733, which chamber is replenished by overflow from the main plating bath 703. Alternatively, in some embodiments the reference electrode is positioned as close to the substrate surface as possible, and the reference electrode chamber is connected via a capillary tube or by another method, to the side of the wafer substrate or directly under the wafer substrate. In some of the preferred embodiments, the apparatus further includes contact sense leads that connect to the wafer periphery and which are configured to sense the potential of the metal seed layer at the periphery of the wafer but do not carry any current to the wafer.

A reference electrode 731 is typically employed when electroplating at a controlled potential is desired. The reference electrode 731 may be one of a variety of commonly used types such as mercury/mercury sulfate, silver chloride, saturated calomel, or copper metal. A contact sense lead in direct contact with the wafer 707 may be used in some embodiments, in addition to the reference electrode, for more accurate potential measurement (not shown).

A DC power supply 735 can be used to control current flow to the wafer 707. The power supply 735 has a negative output lead 739 electrically connected to wafer 707 through one or more slip rings, brushes and contacts (not shown). The positive output lead 741 of power supply 735 is electrically connected to an anode 713 located in plating bath 703. The power supply 735, a reference electrode 731, and a contact sense lead (not shown) can be connected to a system controller 747, which allows, among other functions, modulation of current and potential provided to the elements of electroplating cell. For example, the controller may allow electroplating in potential-controlled and current-controlled regimes. The controller may include program instructions specifying current and voltage levels that need to be applied to various elements of the plating cell, as well as times at which these levels need to be changed. When forward current is applied, the power supply 735 biases the wafer 707 to have a negative potential relative to anode 713. This causes an electrical current to flow from anode 713 to the wafer 707, and an electrochemical reduction (e.g. $Cu^{2+}+2 e^-=Cu^0$) occurs on the wafer surface (the cathode), which results in the deposition of the electrically conductive layer (e.g. copper) on the surfaces of the wafer. An inert anode 714 may be installed below the wafer 707 within the plating bath 703 and separated from the wafer region by the membrane 715.

The apparatus may also include a heater 745 for maintaining the temperature of the plating solution at a specific level. The plating solution may be used to transfer the heat to the other elements of the plating bath. For example, when a wafer 707 is loaded into the plating bath the heater 745 and the pump 717 may be turned on to circulate the plating solution through the electroplating apparatus 701, until the temperature throughout the apparatus becomes substantially uniform. In one embodiment the heater is connected to the system controller 747. The system controller 747 may be connected to a thermocouple to receive feedback of the plating solution temperature within the electroplating apparatus and determine the need for additional heating.

The controller will typically include one or more memory devices and one or more processors. The processor may include a CPU or computer, analog and/or digital input/output connections, stepper motor controller boards, etc. In certain embodiments, the controller controls all of the activities of the electroplating apparatus. Non-transitory machine-readable media containing instructions for controlling process operations in accordance with the present embodiments may be coupled to the system controller.

Typically there will be a user interface associated with controller 747. The user interface may include a display screen, graphical software displays of the apparatus and/or process conditions, and user input devices such as pointing devices, keyboards, touch screens, microphones, etc. The computer program code for controlling electroplating processes can be written in any conventional computer readable programming language: for example, assembly language, C, C++, Pascal, Fortran or others. Compiled object code or script is executed by the processor to perform the tasks identified in the program. One example of a plating apparatus that may be used according to the embodiments herein is the Lam Research Sabre tool. Electrodeposition can be performed in components that form a larger electrodeposition apparatus.

Figure 8:
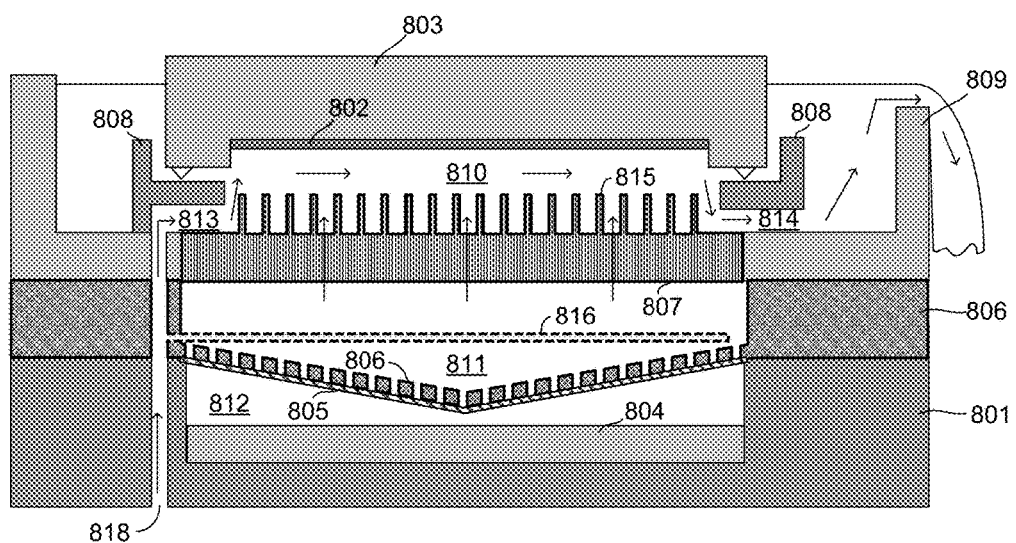

FIG. 8 depicts a simplified cross-sectional view of an electroplating apparatus according to certain embodiments. The apparatus includes an electroplating cell 801, with substrate 802 positioned in a substrate holder 803. Substrate holder 803 is often referred to as a cup, and it may support the substrate 802 at its periphery. An anode 804 is positioned near the bottom of the electroplating cell 801. The anode 804 is separated from the substrate 802 by a membrane 805, which is supported by a membrane frame 806. Membrane frame 806 is sometimes referred to as an anode chamber membrane frame, as it defines the top of the anode chamber housing the anode. Further, the anode 804 is separated from the substrate 802 by an ionically resistive element 807. The ionically resistive element 807 includes openings that allow electrolyte to travel through the ionically resistive element 807 to impinge upon the substrate 802. A front side insert 808 is positioned above the ionically resistive element 807, proximate the periphery of the substrate 802. The front side insert 808 may be ring-shaped, and may be azimuthally non-uniform, as shown. The front side insert 808 is sometimes also referred to as a cross flow confinement ring.

An anode chamber 812 is below the membrane 805, and is where the anode 804 is located. An ionically resistive element manifold 811 is above the membrane 805 and below the ionically resistive element 807. An irrigation flute 816 delivers catholyte to the ionically resistive element manifold 811, and may act to irrigate the membrane 805 during electroplating. In this example, the irrigation flute 816 is fed by electrolyte that passes through catholyte inlet 818. A cross flow manifold 810 is above the ionically resistive element 807 and below the substrate 802. The height of the cross flow manifold is considered to be the distance between the substrate 802 and the plane of the ionically resistive element 807 (excluding the ribs 815 on the upper surface of the ionically resistive element 807, if present). In some cases, the cross flow manifold may have a height between about 1 mm-4 mm, or between about 0.5 mm-15 mm. The cross flow manifold 810 is defined on its sides by the front side insert 808, which acts to contain the cross flowing electrolyte within the cross flow manifold 810. A side inlet 813 to the cross flow manifold 810 is provided azimuthally opposite a side outlet 814 to the cross flow manifold 810. The side inlet 813 and side outlet 814 may be formed, at least partially, by the front side insert 808. As shown by the arrows in FIG. 8, electrolyte travels from the catholyte inlet 818, through the side inlet 813, into the cross flow manifold 810, and out the side outlet 814. In addition, electrolyte may travel through one or more inlets to the ionically resistive element manifold 811 (e.g., inlets in irrigation flute 816 and/or other inlets), into the ionically resistive element manifold 811, through the openings in the ionically resistive element 807, into the cross flow manifold 810, and out the side outlet 814. After passing through the side outlet 814, the electrolyte spills over weir wall 809. The electrolyte may be recovered and recycled.

In certain embodiments, the ionically resistive element 807 approximates a nearly constant and uniform current source in the proximity of the substrate (cathode) and, as such, may be referred to as a high resistance virtual anode (HRVA) or channeled ionically resistive element (CIRP) in some contexts. Normally, the ionically resistive element 807 is placed in close proximity with respect to the wafer. In contrast, an anode in the same close-proximity to the substrate would be significantly less apt to supply a nearly constant current to the wafer, but would merely support a constant potential plane at the anode metal surface, thereby allowing the current to be greatest where the net resistance from the anode plane to the terminus (e.g., to peripheral contact points on the wafer) is smaller. So while the ionically resistive element 807 has been referred to as a high-resistance virtual anode (HRVA), this does not imply that electrochemically the two are interchangeable. Under certain operational conditions, the ionically resistive element 807 would more closely approximate and perhaps be better described as a virtual uniform current source, with nearly constant current being sourced from across the upper plane of the ionically resistive element 807.

The ionically resistive element 807 contains micro size (typically less than 0.04") through-holes that are spatially and ionically isolated from each other and do not form interconnecting channels within the body of ionically resistive element, in many but not all implementations. Such through-holes are often referred to as non-communicating through-holes. They typically extend in one dimension, often, but not necessarily, normal to the plated surface of the wafer (in some embodiments the non-communicating holes are at an angle with respect to the wafer which is generally parallel to the ionically resistive element front surface). Often the through-holes are parallel to one another. Often the holes are arranged in a square array. Other times the layout is in an offset spiral pattern. These through-holes are distinct from 3-D porous networks, where the channels extend in three dimensions and form interconnecting pore structures, because the through-holes restructure both ionic current flow and (in certain cases) fluid flow parallel to the surface therein, and straighten the path of both current and fluid flow towards the wafer surface. However, in certain embodiments, such a porous plate, having an interconnected network of pores, may be used as the ionically resistive element. When the distance from the plate's top surface to the wafer is small (e.g., a gap of about 1/10 the size of the wafer radius, for example less than about 5 mm), divergence of both current flow and fluid flow is locally restricted, imparted and aligned with the ionically resistive element channels.

One example ionically resistive element 807 is a disc made of a solid, non-porous dielectric material that is ionically and electrically resistive. The material is also chemically stable in the plating solution of use. In certain cases the ionically resistive element 807 is made of a ceramic material (e.g., aluminum oxide, stannic oxide, titanium oxide, or mixtures of metal oxides) or a plastic material (e.g., polyethylene, polypropylene, polyvinylidene difluoride (PVDF), polytetrafluoroethylene, polysulphone, polyvinyl chloride (PVC), polycarbonate, and the like), having between about 6,000-12,000 non-communicating through-holes. The ionically resistive element 807, in many embodiments, is substantially coextensive with the wafer (e.g., the ionically resistive element 807 has a diameter of about 300 mm when used with a 300 mm wafer) and resides in close proximity to the wafer, e.g., just below the wafer in a wafer-facing-down electroplating apparatus. Preferably, the plated surface of the wafer resides within about 10 mm, more preferably within about 5 mm of the closest ionically resistive element surface. To this end, the top surface of the ionically resistive element 807 may be flat or substantially flat. Often, both the top and bottom surfaces of the ionically resistive element 807 are flat or substantially flat. In a number of embodiments, however, the top surface of the ionically resistive element 807 includes a series of linear ribs, as described further below.

As above, the overall ionic and flow resistance of the plate 807 is dependent on the thickness of the plate and both the overall porosity (fraction of area available for flow through the plate) and the size/diameter of the holes. Plates of lower porosities will have higher impinging flow velocities and ionic resistances. Comparing plates of the same porosity, one having smaller diameter 1-D holes (and therefore a larger number of 1-D holes) will have a more micro-uniform distribution of current on the wafer because there are more individual current sources, which act more as point sources that can spread over the same gap, and will also have a higher total pressure drop (high viscous flow resistance).

In some cases, about 1-10% of the ionically resistive element 807 is open area through which ionic current can pass (and through which electrolyte can pass if there is no other element blocking the openings). In particular embodiments, about 2-5% the ionically resistive element 807 is open area. In a specific example, the open area of the ionically resistive element 807 is about 3.2% and the effective total open cross sectional area is about 23 cm$^2$. In some embodiments, non-communicating holes formed in the ionically resistive element 807 have a diameter of about 0.01 to 0.08 inches. In some cases, the holes have a diameter of about 0.02 to 0.03 inches, or between about 0.03-0.06 inches. In various embodiments the holes have a diameter that is at most about 0.2 times the gap distance between the ionically resistive element 807 and the wafer. The holes are generally circular in cross section, but need not be. Further, to ease construction, all holes in the ionically resistive element 807 may have the same diameter. However this need not be the case, and both the individual size and local density of holes may vary over the ionically resistive element surface as specific requirements may dictate.

The ionically resistive element 807 shown in FIG. 8 includes a series of linear ribs 815 that extend into/out of the page. The ribs 815 are sometimes referred to as protuberances. The ribs 815 are positioned on the top surface of the ionically resistive element 807, and in many cases they are oriented such that their length (e.g., their longest dimension) is perpendicular to the direction of cross flowing electrolyte. In a particular embodiment, the ribs 815 may be oriented such that their length is parallel to the direction of cross flowing electrolyte. The ribs 815 affect the fluid flow and current distribution within the cross flow manifold 810. For instance, the cross flow of electrolyte is largely confined to the area above the top surface of the ribs 815, creating a high rate of electrolyte cross flow in this area. In the regions between adjacent ribs 815, current delivered upward through the ionically resistive element 807 is redistributed, becoming more uniform, before it is delivered to the substrate surface.

In FIG. 8, the direction of cross flowing electrolyte is left-to-right (e.g., from the side inlet 813 to the side outlet 814), and the ribs 815 are oriented such that their lengths extend into/out of the page. In certain embodiments, the ribs 815 may have a width (measured left-to-right in FIG. 8) between about 0.5 mm-1.5 mm, or between about 0.25 mm-10 mm. The ribs 815 may have a height (measured up-down in FIG. 8) between about 1.5 mm-3.0 mm, or between about 0.25 mm-7.0 mm. The ribs 815 may have a height to width aspect ratio (height/width) between about 5/1-2/1, or between about 7/1-1/7. The ribs 815 may have a pitch between about 10 mm-30 mm, or between about 5 mm-150 mm. The ribs 815 may have variable lengths (measured into/out of the page in FIG. 8) that extend across the face of the ionically resistive element 807. The distance between the upper surface of the ribs 815 and the surface of the substrate 802 may be between about 1 mm-4 mm, or between about 0.5 mm-15 mm. The ribs 815 may be provided over an area that is about coextensive with the substrate, as shown in FIG. 8. The channels/openings in the ionically resistive element 807 may be positioned between adjacent ribs 815, or they may extend through the ribs 815 (in other words, the ribs 815 may or may not be channeled). In some other embodiments, the ionically resistive element 807 may have an upper surface that is flat (e.g., does not include the ribs 815). The electroplating apparatus shown in FIG. 8, including the ionically resistive element with ribs thereon, is further discussed in U.S. Pat. No. 9,523,155, titled "ENHANCEMENT OF ELECTROLYTE HYDRODYNAMICS FOR EFFICIENT MASS TRANSFER DURING ELECTROPLATING," which is herein incorporated by reference in its entirety.

The apparatus may include various additional elements as needed for a particular application. In some cases, an edge flow element may be provided proximate the periphery of the substrate, within the cross flow manifold. The edge flow element may be shaped and positioned to promote a high degree of electrolyte flow (e.g., cross flow) near the edges of the substrate. The edge flow element may be ring-shaped or arc-shaped in certain embodiments, and may be azimuthally uniform or non-uniform. Edge flow elements are further discussed in U.S. patent application Ser. No. 14/924,124, filed Oct. 27, 2015, and titled "EDGE FLOW ELEMENT FOR ELECTROPLATING APPARATUS," which is herein incorporated by reference in its entirety.

In some cases, the apparatus may include a sealing member for temporarily sealing the cross flow manifold. The sealing member may be ring-shaped or arc-shaped, and may be positioned proximate the edges of the cross flow manifold. A ring-shaped sealing member may seal the entire cross flow manifold, while an arc-shaped sealing member may seal a portion of the cross flow manifold (in some cases leaving the side outlet open). During electroplating, the sealing member may be repeatedly engaged and disengaged to seal and unseal the cross flow manifold. The sealing member may be engaged and disengaged by moving the substrate holder, ionically resistive element, front side insert, or other portion of the apparatus that engages with the sealing member. Sealing members and methods of modulating cross flow are further discussed in the following U.S. Patent Applications, each of which is herein incorporated by reference in its entirety: U.S. patent application Ser. No. 15/225,716, filed Aug. 1, 2016, and titled "DYNAMIC MODULATION OF CROSS FLOW MANIFOLD DURING ELECTROPLATING"; and U.S. patent application Ser. No. 15/161,081, filed May 20, 2016, and titled "DYNAMIC MODULATION OF CROSS FLOW MANIFOLD DURING ELECTROPLATING."

In various embodiments, one or more electrolyte jet may be provided to deliver additional electrolyte above the ionically resistive element. The electrolyte jet may deliver electrolyte proximate a periphery of the substrate, or at a location that is closer to the center of the substrate, or both. The electrolyte jet may be oriented in any position, and may deliver cross flowing electrolyte, impinging electrolyte, or a combination thereof. Electrolyte jets are further described in U.S. patent application Ser. No. 15/455,011, filed Mar. 9, 2017, and titled "ELECTROPLATING APPARATUS AND METHODS UTILIZING INDEPENDENT CONTROL OF IMPINGING ELECTROLYTE," which is herein incorporated by reference in its entirety.

Figure 9:
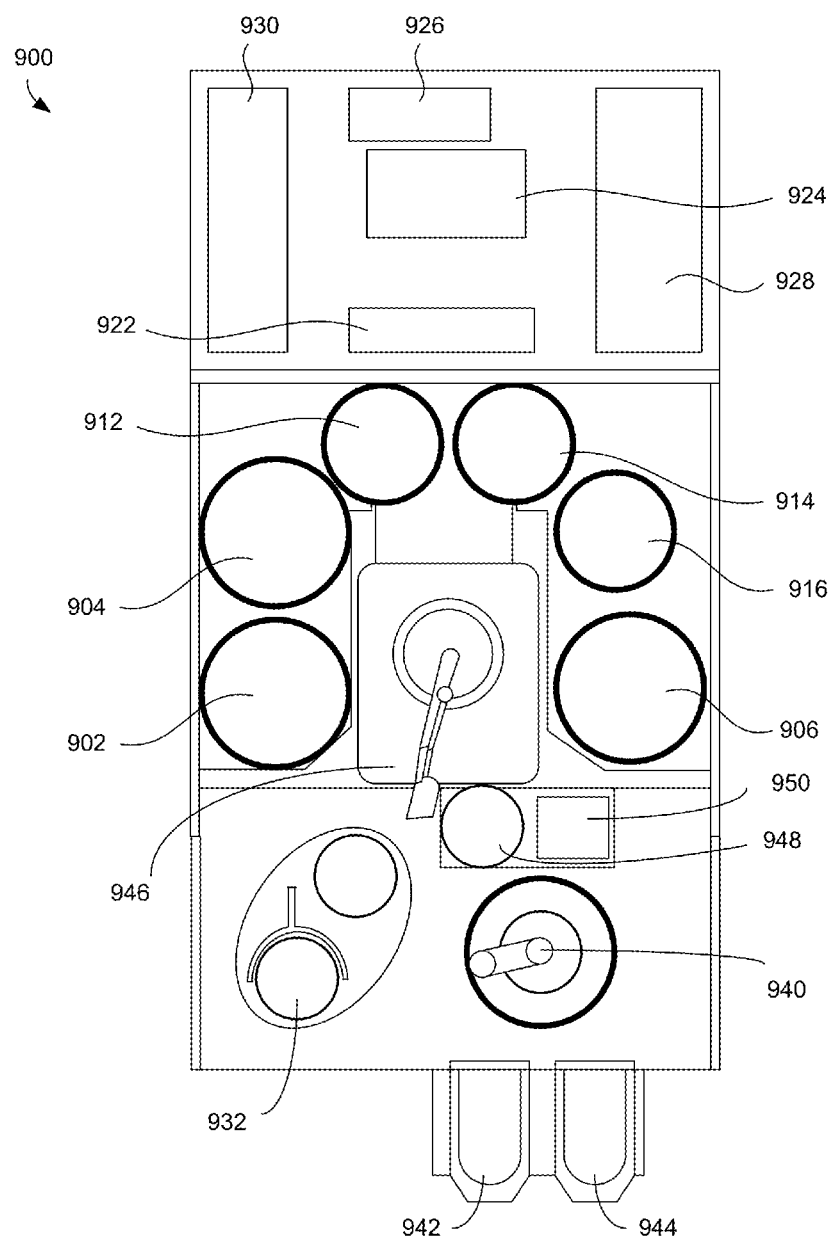
FIG. 9 illustrates a simplified top-down view of a multi-tool electroplating apparatus according to certain embodiments.

FIG. 9 shows a schematic of a top view of an example electrodeposition apparatus. The electrodeposition apparatus 900 can include three separate electroplating modules 902, 904, and 906. The electrodeposition apparatus 900 can also include three separate modules 912, 914, and 916 configured for various process operations. For example, in some embodiments, one or more of modules 912, 914, and 916 may be a spin rinse drying (SRD) module. In other embodiments, one or more of the modules 912, 914, and 916 may be post-electrofill modules (PEMs), each configured to perform a function, such as edge bevel removal, backside etching, and acid cleaning of substrates after they have been processed by one of the electroplating modules 902, 904, and 906.

The electrodeposition apparatus 900 includes a central electrodeposition chamber 924. The central electrodeposition chamber 924 is a chamber that holds the chemical solution used as the electroplating solution in the electroplating modules 902, 904, and 906. The electrodeposition apparatus 900 also includes a dosing system 926 that may store and deliver additives for the electroplating solution. A chemical dilution module 922 may store and mix chemicals to be used as an etchant. A filtration and pumping unit 928 may filter the electroplating solution for the central electrodeposition chamber 924 and pump it to the electroplating modules.

A system controller 930 provides electronic and interface controls required to operate the electrodeposition apparatus 900. The system controller 930 (which may include one or more physical or logical controllers) controls some or all of the properties of the electroplating apparatus 900.

Signals for monitoring the process may be provided by analog and/or digital input connections of the system controller 930 from various process tool sensors. The signals for controlling the process may be output on the analog and digital output connections of the process tool. Non-limiting examples of process tool sensors that may be monitored include mass flow controllers, pressure sensors (such as manometers), thermocouples, optical position sensors, etc. Appropriately programmed feedback and control algorithms may be used with data from these sensors to maintain process conditions.

A hand-off tool 940 may select a substrate from a substrate cassette such as the cassette 942 or the cassette 944. The cassettes 942 or 944 may be front opening unified pods (FOUPs). A FOUP is an enclosure designed to hold substrates securely and safely in a controlled environment and to allow the substrates to be removed for processing or measurement by tools equipped with appropriate load ports and robotic handling systems. The hand-off tool 940 may hold the substrate using a vacuum attachment or some other attaching mechanism.

The hand-off tool 940 may interface with a wafer handling station 932, the cassettes 942 or 944, a transfer station 950, or an aligner 948. From the transfer station 950, a hand-off tool 946 may gain access to the substrate. The transfer station 950 may be a slot or a position from and to which hand-off tools 940 and 946 may pass substrates without going through the aligner 948. In some embodiments, however, to ensure that a substrate is properly aligned on the hand-off tool 946 for precision delivery to an electroplating module, the hand-off tool 946 may align the substrate with an aligner 948. The hand-off tool 946 may also deliver a substrate to one of the electroplating modules 902, 904, or 906 or to one of the three separate modules 912, 914, and 916 configured for various process operations.

An example of a process operation according to the methods described above may proceed as follows: (1) electrodeposit copper or another material onto a substrate in the electroplating module 904; (2) rinse and dry the substrate in SRD in module 912; and, (3) perform edge bevel removal in module 914.

An apparatus configured to allow efficient cycling of substrates through sequential plating, rinsing, drying, and PEM process operations may be useful for implementations for use in a manufacturing environment. To accomplish this, the module 912 can be configured as a spin rinse dryer and an edge bevel removal chamber. With such a module 912, the substrate would only need to be transported between the electroplating module 904 and the module 912 for the copper plating and EBR operations. In some embodiments the methods described herein will be implemented in a system which comprises an electroplating apparatus and a stepper.

System Controller

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The various hardware and method embodiments described above may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility.

Lithographic patterning of a film typically comprises some or all of the following steps, each step enabled with a number of possible tools: (1) application of photoresist on a workpiece, e.g., a substrate having a silicon nitride film formed thereon, using a spin-on or spray-on tool; (2) curing of photoresist using a hot plate or furnace or other suitable curing tool; (3) exposing the photoresist to visible or UV or x-ray light with a tool such as a wafer stepper; (4) developing the resist so as to selectively remove resist and thereby pattern it using a tool such as a wet bench or a spray developer; (5) transferring the resist pattern into an underlying film or workpiece by using a dry or plasma-assisted etching tool; and (6) removing the resist using a tool such as an RF or microwave plasma resist stripper. In some embodiments, an ashable hard mask layer (such as an amorphous carbon layer) and another suitable hard mask (such as an antireflective layer) may be deposited prior to applying the photoresist.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated may be performed in the sequence illustrated, in other sequences, in parallel, or in some cases omitted. Likewise, the order of the above described processes may be changed. Certain references have been incorporated by reference herein. It is understood that any disclaimers or disavowals made in such references do not necessarily apply to the embodiments described herein. Similarly, any features described as necessary in such references may be omitted in the embodiments herein.

The subject matter of the present disclosure includes all novel and nonobvious combinations and sub-combinations of the various processes, systems and configurations, and other features, functions, acts, and/or properties disclosed herein, as well as any and all equivalents thereof.

What is claimed is:

1. A method of electroplating material onto a substrate, the method comprising:
   providing the substrate to an electroplating apparatus, wherein the substrate is a semiconductor substrate comprising a plurality of features recessed into a surface of the substrate;
   immersing the substrate in electrolyte in the electroplating apparatus;
   in a first stage, electroplating the material on to the substrate while flowing electrolyte within or through the electroplating apparatus to provide moderate or high convection conditions at the surface of the substrate;
   switching from the first stage to a second stage when a first switching condition is met;
   in the second stage, electroplating the material onto the substrate while flowing electrolyte within or through the electroplating apparatus to provide ultra-low convection conditions at the surface of the substrate,
      wherein at the ultra-low convection conditions, electrolyte flow proximate the surface of the substrate is laminar, and mass transport of metal ions in the electrolyte within the features is dominated by diffusion rather than convection over at least 75% of a depth of the features, and
      wherein the moderate or high convection conditions provide greater convection to the surface of the substrate compared to the ultra-low convection conditions; and
   removing the substrate from the electrolyte.

2. The method of claim 1, wherein high convection conditions are applied during the first stage, wherein at the high convection conditions, either (i) electrolyte flow proximate the surface of the substrate is turbulent, and/or (ii) a velocity of electrolyte flow proximate the surface of the substrate is within about 10% of a velocity at which turbulence is achieved.

3. The method of claim 1, wherein moderate convection conditions are applied during the first stage, wherein at the moderate convection conditions mass transport of metal ions in the electrolyte within the features is dominated by diffusion rather than convection over about 50% or less of the depth of the features.

4. The method of claim 1, wherein the first switching condition is met when the electrolyte has sufficiently diffused into the features.

5. The method of claim 1, wherein the first switching condition is met when a current applied to the substrate is below a limiting current that will be experienced upon switching to the second stage.

6. The method of claim 1, wherein the first switching condition is met when organic plating additives including at least a suppressor are stabilized within the features.

7. The method of claim 1, wherein the first switching condition is met when:
   (a) the electrolyte has sufficiently diffused into the features,
   (b) a current applied to the substrate is below a limiting current that will be experienced upon switching to the second stage, and
   (c) organic plating additives including at least a suppressor are stabilized within the features.

8. The method of claim 1, further comprising:
   switching from the second stage to a third stage when a second switching condition is met; and
   in the third stage, electroplating the material on to the substrate while flowing electrolyte within or through the electroplating apparatus to provide moderate or high convection conditions at the surface of the substrate.

9. The method of claim 8, wherein the features include a first feature and a second feature, the first feature having a wider critical dimension compared to the second feature, the first and second features each having an instantaneous height as measured from a common reference plane, wherein the second switching condition is met when a difference between the instantaneous height of the second feature and the instantaneous height of the first feature reaches a target height gap.

10. The method of claim 9, wherein the target height gap is at least about 0.5 µm.

11. The method of claim 10, wherein the target height gap is at least about 1 µm.

12. The method of claim 10, wherein the critical dimension of the first feature is at least about 20 µm wider than the second feature, and wherein the target height gap is at least about 2 µm.

13. The method of claim 8, wherein the second switching condition takes into account a target within wafer non-uniformity for the substrate.

14. The method of claim 1, wherein the features include a first feature and a second feature, wherein the first feature has a wider critical dimension compared to the second feature.

15. The method of claim 14, wherein the features are defined in a layer of photoresist, the method further comprising:
   after removing the substrate from the electrolyte, forming a cap layer on the material deposited in the features;
   after forming the cap layer, removing the photoresist from the surface of the substrate; and
   reflowing the cap layer.

16. The method of claim 14, wherein after the cap layer is reflowed, a height gap between the first feature and the second feature is smaller than before the cap layer is reflowed, where the height gap is measured as a distance between an instantaneous height of the first feature and an instantaneous height of the second feature, as measured from a common reference plane.

17. The method of claim 16, wherein before the cap layer is reflowed the height gap between the first feature and the second feature is at least about 2 µm, and wherein after the cap layer is reflowed, the height gap between the first feature and the second feature is about 0.5 µm or less.

18. The method of claim 17, wherein after the cap layer is reflowed, the height gap between the first feature and the second feature is about 0.1 µm or less.

19. An apparatus for electroplating material onto a substrate, the apparatus comprising:
   an electroplating chamber;

a substrate support; and
a controller configured to:
- cause a substrate to be provided to an electroplating apparatus, wherein the substrate is a semiconductor substrate comprising a plurality of features recessed into a surface of the substrate;
- cause the substrate to be immersed in electrolyte in the electroplating apparatus;
- in a first stage, cause the material to be electroplated on to the substrate while flowing electrolyte within or through the electroplating apparatus to provide moderate or high convection conditions at the surface of the substrate;
- switch from the first stage to a second stage when a first switching condition is met;
- in the second stage, causing the material to be electroplated onto the substrate while flowing electrolyte within or through the electroplating apparatus to provide ultra-low convection conditions at the surface of the substrate,
  - wherein at the ultra-low convection conditions, electrolyte flow proximate the surface of the substrate is laminar, and mass transport of metal ions in the electrolyte within the features is dominated by diffusion rather than convection over at least 75% of a depth of the features, and
  - wherein the moderate or high convection conditions provide greater convection to the surface of the substrate compared to the ultra-low convection conditions; and
- causing the substrate to be removed from the electrolyte.

* * * * *